US012733307B2

(12) United States Patent
Hayashi et al.

(10) Patent No.: US 12,733,307 B2
(45) Date of Patent: Sep. 8, 2026

(54) LIGHT-EMITTING DEVICE AND MANUFACTURING METHOD THEREOF

(71) Applicant: NICHIA CORPORATION, Anan (JP)

(72) Inventors: Tatsuya Hayashi, Tokushima (JP); Shinya Okura, Tokushima (JP); Yusuke Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 537 days.

(21) Appl. No.: 18/306,566

(22) Filed: Apr. 25, 2023

(65) Prior Publication Data

US 2023/0352635 A1 Nov. 2, 2023

(30) Foreign Application Priority Data

Apr. 28, 2022 (JP) ................................ 2022-075065

(51) Int. Cl.

*H10H 20/851* (2025.01)
*H10H 20/01* (2025.01)
*H10H 20/856* (2025.01)
*H10H 20/857* (2025.01)

(52) U.S. Cl.

CPC .... *H10H 20/8512* (2025.01); *H10H 20/8514* (2025.01); *H10H 20/856* (2025.01); *H10H 20/857* (2025.01); *H10H 20/0361* (2025.01); *H10H 20/0363* (2025.01)

(58) Field of Classification Search

CPC ............. H10H 29/362; H10H 29/8508; H10H 20/8515; H10H 20/8508; H10H 29/852; H10H 20/852; H10H 20/814; H10H 29/036; H10H 20/0361; H10H 20/84–841;

(Continued)

(56) References Cited

U.S. PATENT DOCUMENTS

2011/0026266 A1 2/2011 Sasaki et al.
2011/0300644 A1 12/2011 Akimoto et al.
2012/0051075 A1 3/2012 Harada et al.

(Continued)

FOREIGN PATENT DOCUMENTS

CN 108807647 A 11/2018
JP 2009266434 A 11/2009

(Continued)

*Primary Examiner* — Julio J Maldonado
*Assistant Examiner* — Eric Manuel Mulero Flores
(74) *Attorney, Agent, or Firm* — Spencer Fane LLP

(57) ABSTRACT

A light-emitting device includes a light-emitting element, a wavelength conversion member, and a light adjustment member. The light-emitting element includes a support substrate, and a first light-emitting portion and a second light-emitting portion disposed adjacent to each other. The wavelength conversion member is configured to perform wavelength conversion of first light emitted from the first light-emitting portion and second light emitted from the second light-emitting portion into third light. The light adjustment member overlaps one of the first light-emitting portion and the second light-emitting portion in a plan view. In the light-emitting element, an emission intensity of the first light at a light emission peak wavelength of the second light is lower than an emission intensity of the second light at the light emission peak wavelength of the second light, during light emission of the light-emitting device.

16 Claims, 17 Drawing Sheets

(58) Field of Classification Search
CPC ... H10H 29/8421; H10H 29/851–8514; H10H 29/10–142
See application file for complete search history.

(56) References Cited

U.S. PATENT DOCUMENTS

| | | | |
|---|---|---|---|
| 2013/0082294 | A1 | 4/2013 | Nakayama et al. |
| 2013/0100692 | A1 | 4/2013 | Yokobayashi |
| 2014/0175491 | A1 | 6/2014 | Sanga et al. |
| 2016/0372515 | A1 | 12/2016 | Miyoshi et al. |
| 2018/0029523 | A1 | 2/2018 | Shichijo |
| 2018/0129121 | A1* | 5/2018 | Van Der Sijde ....... H05B 47/11 |
| 2018/0190871 | A1* | 7/2018 | Kim .................. H10H 20/8513 |
| 2019/0251894 | A1* | 8/2019 | Lee ..................... H10H 20/852 |
| 2020/0041085 | A1 | 2/2020 | Miyairi et al. |
| 2020/0393103 | A1 | 12/2020 | Miyairi et al. |
| 2021/0104501 | A1 | 4/2021 | Hisanaga et al. |
| 2022/0352447 | A1* | 11/2022 | Lee .................... H10H 20/8514 |
| 2023/0112703 | A1* | 4/2023 | Hsing Chen ......... H10H 20/857 257/79 |

FOREIGN PATENT DOCUMENTS

| | | | |
|---|---|---|---|
| JP | 2010016029 | A | 1/2010 |
| JP | 2011134829 | A | 7/2011 |
| JP | 2012019201 | A | 1/2012 |
| JP | 2012049022 | A | 3/2012 |
| JP | 2013084889 | A | 5/2013 |
| JP | 2013089814 | A | 5/2013 |
| JP | 2014127513 | A | 7/2014 |
| JP | 2017011259 | A | 1/2017 |
| JP | 2018022723 | A | 2/2018 |
| JP | 2019135756 | A | 8/2019 |
| JP | 2020025063 | A | 2/2020 |
| JP | 2020120082 | A | 8/2020 |
| WO | 2019244582 | A1 | 12/2019 |

* cited by examiner

FIG. 1A 100
10
20
30
60
50
51
52

LIGHT-EMITTING DEVICE AND MANUFACTURING METHOD THEREOF

CROSS-REFERENCE TO RELATED APPLICATIONS

The present application claims priority under 35 U.S.C. § 119 to Japanese Patent Application No. 2022-075065, filed Apr. 28, 2022, the disclosure of which is hereby incorporated herein by reference in its entirety.

BACKGROUND

The present disclosure relates to a light-emitting device and a manufacturing method thereof.

In recent years, LEDs have been used as light sources for vehicle lamps such as headlights. For example, Japanese Patent Publication No. 2017-011259 discloses a light-emitting device having a light distribution pattern suitable for a headlight with use of a combination of a plurality of light-emitting elements having different areas.

SUMMARY

It is an object of the embodiment of the present disclosure to provide a light-emitting device that can be miniaturized and a method for manufacturing such a light-emitting device.

A light-emitting device according to an embodiment of the present disclosure includes a light-emitting element, a wavelength conversion member, and a light adjustment member. The light-emitting element includes a support substrate having a first surface and a second surface opposite to the first surface, and a first light-emitting portion and a second light-emitting portion disposed adjacent to each other on the second surface of the support substrate. The first light-emitting portion and the second light-emitting portion each includes a semiconductor layered body including a first semiconductor layer, a light-emitting layer, and a second semiconductor layer in this order. The wavelength conversion member is disposed on the first surface of the support substrate and contains a phosphor configured to perform wavelength conversion of first light emitted from the first light-emitting portion and second light emitted from the second light-emitting portion into third light. The light adjustment member is disposed on a surface of the wavelength conversion member opposite to a surface on a support substrate side and overlaps one of the first light-emitting portion and the second light-emitting portion in a plan view. In the light-emitting element, an emission intensity of the first light at a light emission peak wavelength of the second light is lower than an emission intensity of the second light at the light emission peak wavelength of the second light, during light emission of the light-emitting device.

A method for manufacturing a light-emitting device, according to an embodiment of the present disclosure, includes preparing a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; preparing a wavelength conversion member having a first surface and a second surface opposite to the first surface and containing a phosphor configured to perform wavelength conversion of first light emitted from the first light-emitting portion and second light emitted from the second light-emitting portion into third light, the first surface of the wavelength conversion member being provided with a light adjustment member; and disposing the wavelength conversion member provided with the light adjustment member such that the second surface of the wavelength conversion member faces the first surface of the support substrate and the light adjustment member overlaps one of the first light-emitting portion and the second light-emitting portion in a plan view.

According to the embodiments of the present disclosure, a light-emitting device that can be miniaturized and a method for manufacturing such a light-emitting device can be provided.

BRIEF DESCRIPTION OF THE DRAWINGS

Figure 1A:
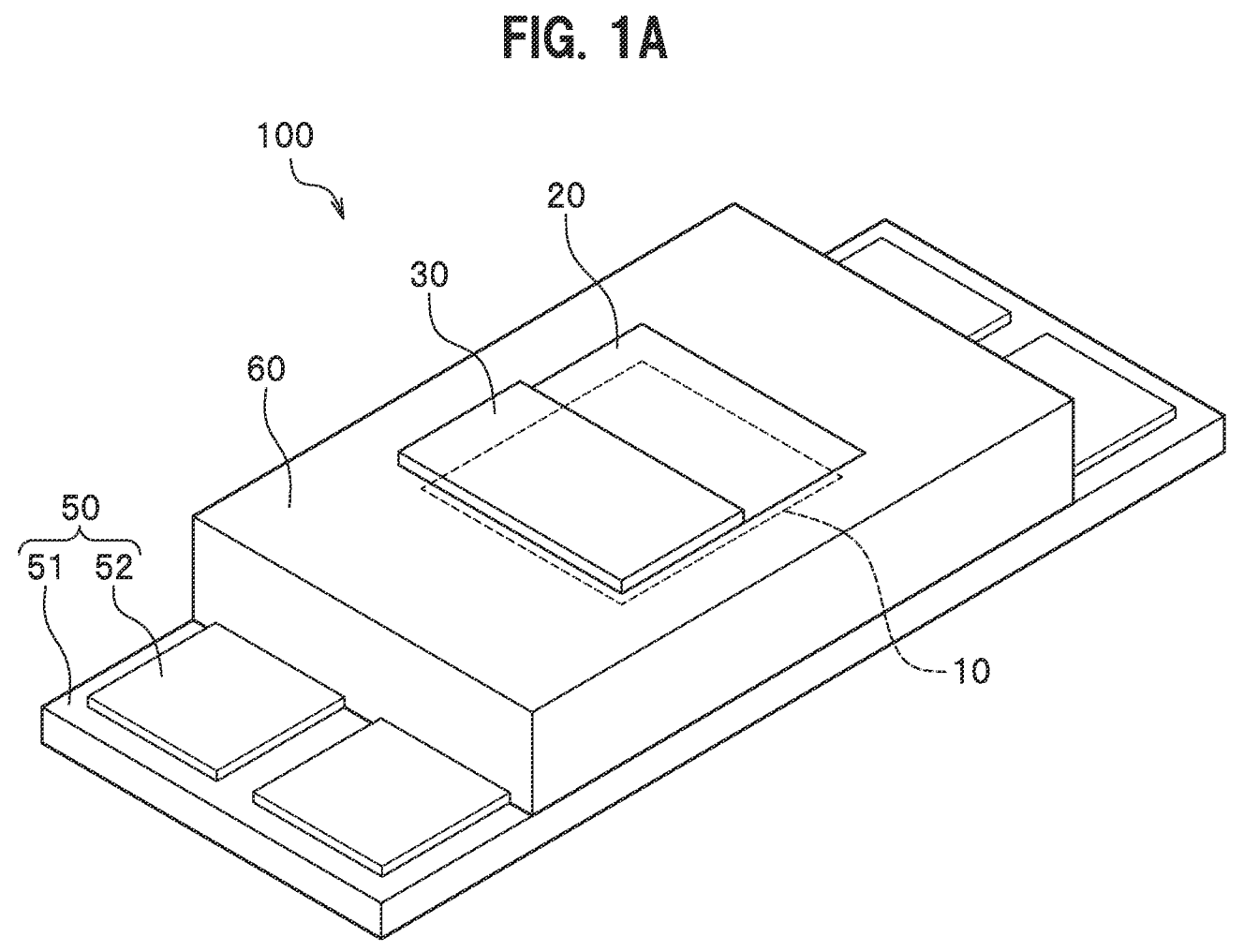

FIG. 1A is a schematic perspective view illustrating an example of a light-emitting device according to a first embodiment.

DETAILED DESCRIPTION

Figure 1B:
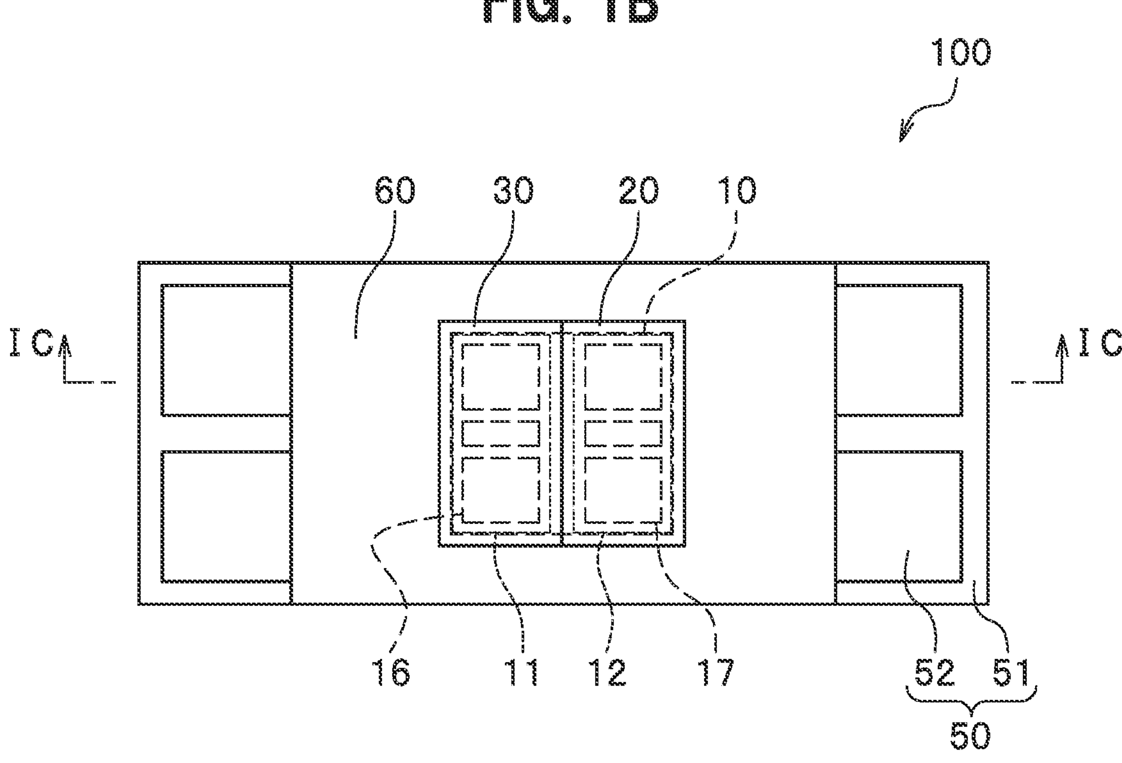
FIG. 1B is a schematic plan view illustrating an example of the light-emitting device according to the first embodiment.

Embodiments will be described below with reference to the drawings. The following embodiments are examples of light-emitting devices and methods for manufacturing the light-emitting devices to embody the technical concept of the present embodiments, and are not limited to those illustrated below. In addition, dimensions, materials, shapes, relative arrangements, or the like of components described in the embodiments are not intended to limit the scope of the present disclosure thereto, unless otherwise specified, and are merely exemplary. Note that, size, positional relationship, and the like of members illustrated in the drawings can be exaggerated or simplified for clarity of description. To avoid overcomplicating the drawings, some elements may be omitted or end views illustrating only cut surfaces may be used as cross-sectional views. As used herein, the term “covering” is not limited to cases of direct contact, but also includes cases of indirect covering a member, for example, via another member. Furthermore, “disposing” is not limited to cases of direct contact, but also includes cases of indirectly disposing a member, for example, via another member.

First Embodiment

Light-Emitting Device

Figure 1C:
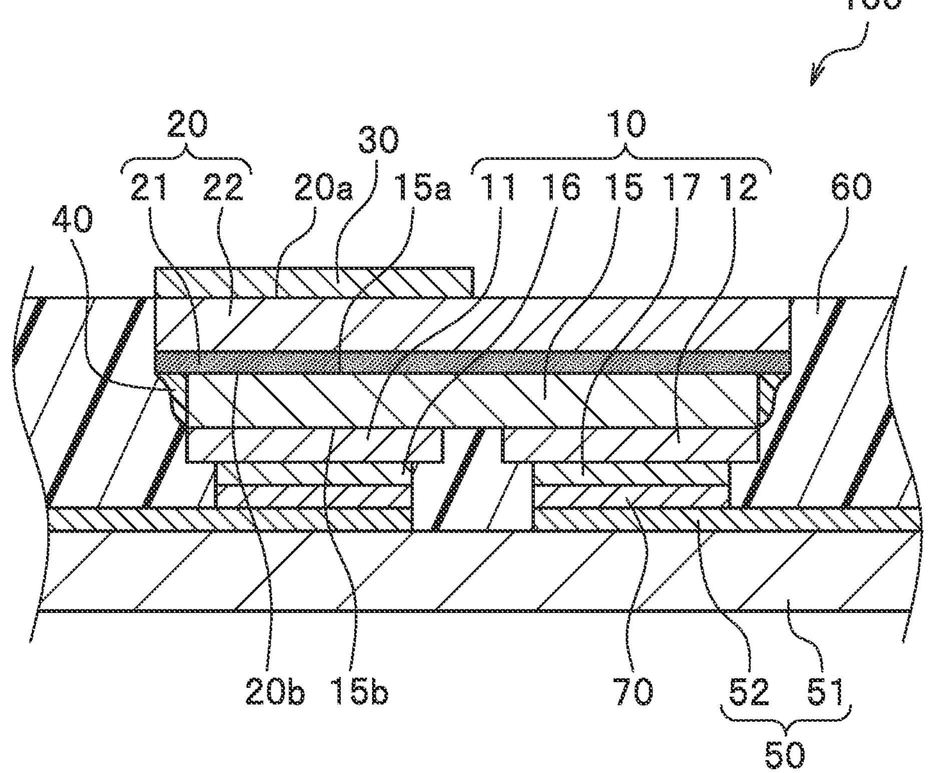
FIG. 1C is a schematic cross-sectional view taken along line IC-IC of FIG. 1B.
Figure 1D:
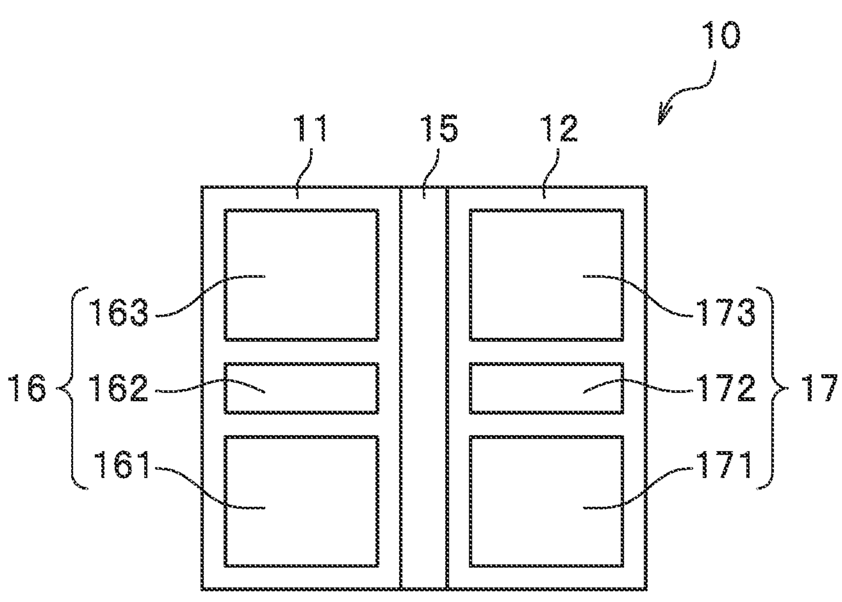
FIG. 1D is a schematic bottom view illustrating an example of a light-emitting element of the light-emitting device according to the first embodiment.
Figure 1E:
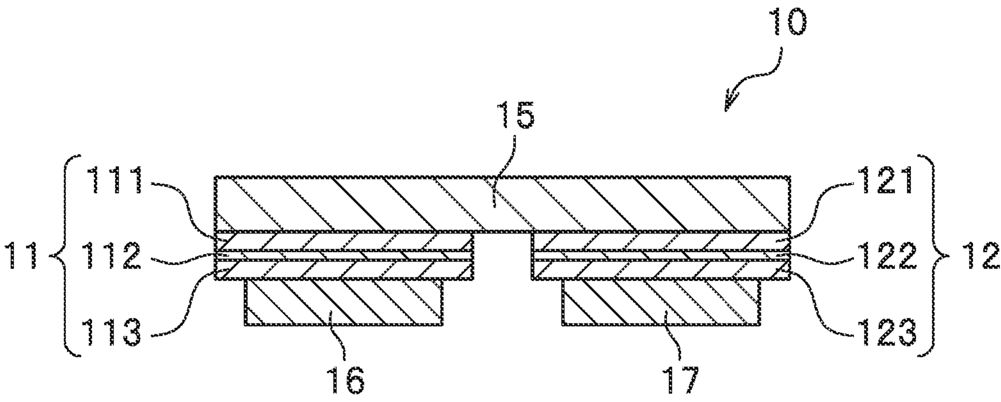
FIG. 1E is a schematic cross-sectional view illustrating an example of the light-emitting element of the light-emitting device according to the first embodiment.
Figure 1F:
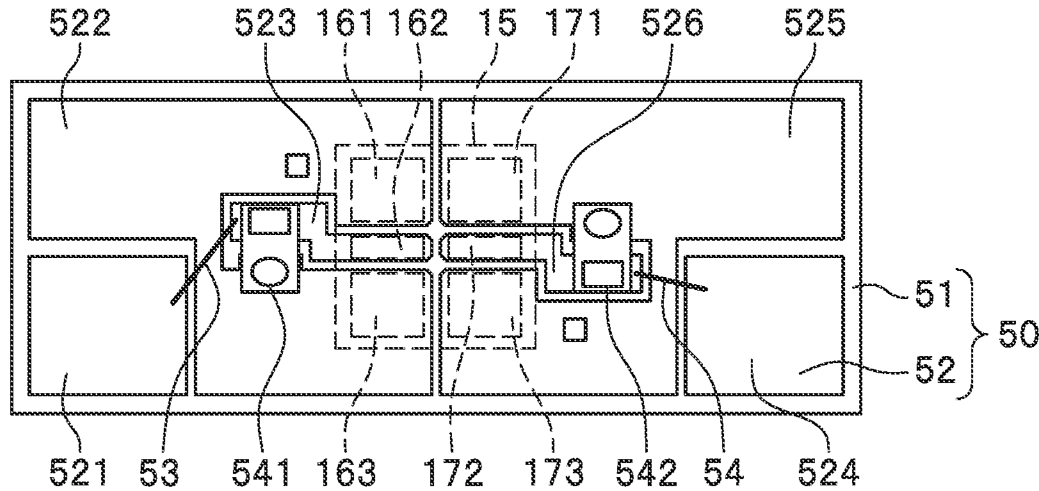
FIG. 1F is a schematic plan view for explaining a wiring substrate of the light-emitting device according to the first embodiment.
Figure 1G:
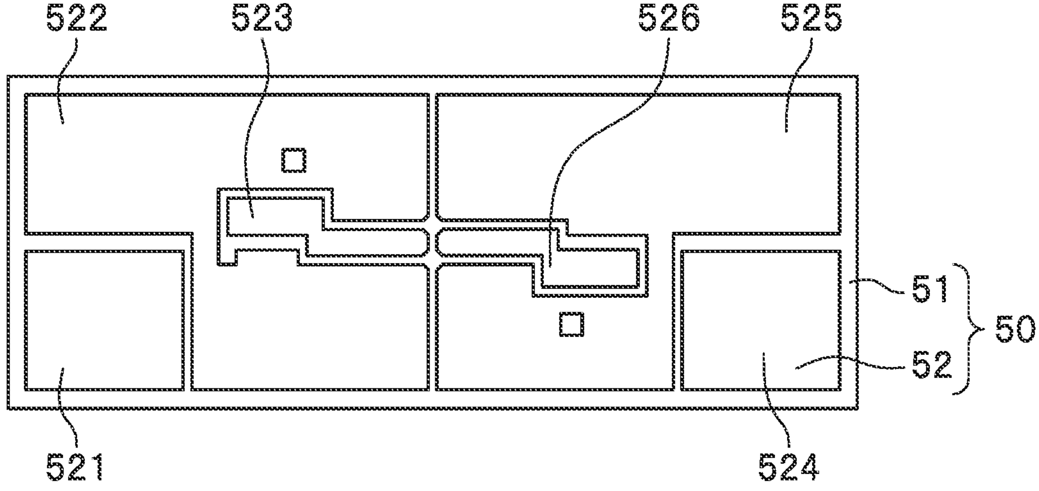
FIG. 1G is a schematic plan view illustrating an example of a wiring substrate of the light-emitting device according to the first embodiment.
Figure 2A:
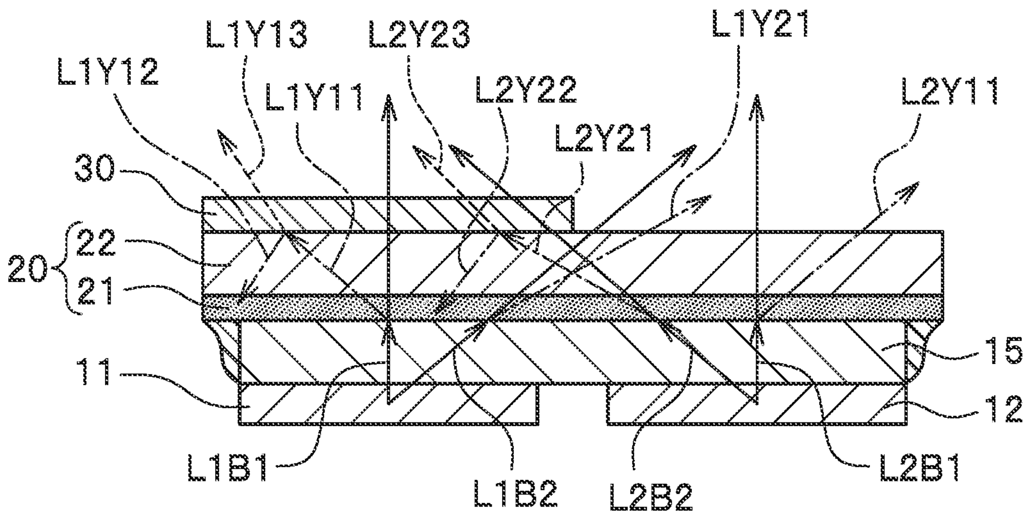
FIG. 2A is a schematic cross-sectional view for explaining an optical path of light from a light-emitting portion of the light-emitting device according to the first embodiment.
Figure 2B:
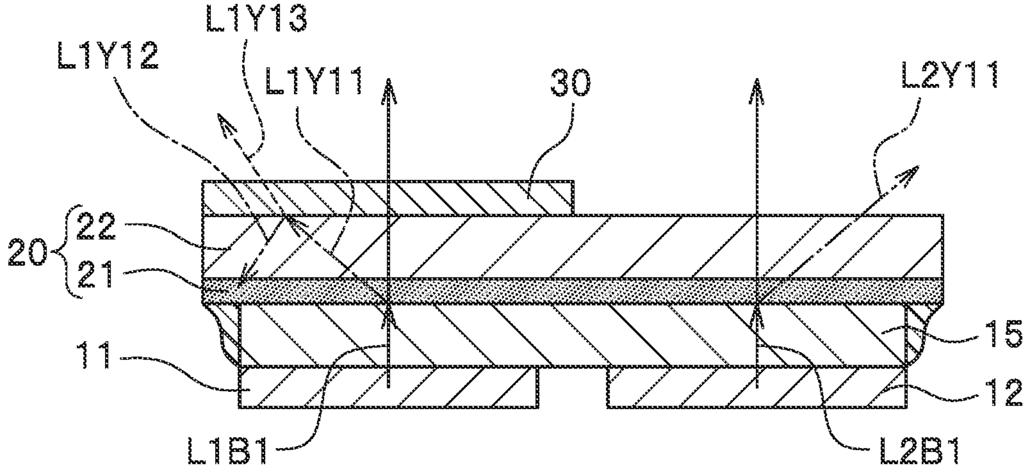
FIG. 2B is a schematic cross-sectional view simplifying FIG. 2A.

FIG. 1A is a schematic perspective view illustrating an example of a light-emitting device according to a first embodiment. FIG. 1B is a schematic plan view illustrating an example of the light-emitting device according to the first embodiment. FIG. 1C is a schematic cross-sectional view taken along line IC-IC of FIG. 1B. FIG. 1D is a schematic bottom view illustrating an example of a light-emitting element of the light-emitting device according to the first embodiment. FIG. 1E is a schematic cross-sectional view illustrating an example of the light-emitting element of the light-emitting device according to the first embodiment. FIG. 1F is a schematic plan view for explaining a wiring substrate of the light-emitting device according to the first embodiment. FIG. 1G is a schematic plan view illustrating an example of the wiring substrate of the light-emitting device according to the first embodiment. FIG. 2A is a schematic cross-sectional view for explaining an optical path of light from a light-emitting portion of the light-emitting device according to the first embodiment. FIG. 2B is a schematic cross-sectional view simplifying FIG. 2A.

A light-emitting device 100 includes a light-emitting element 10 including a support substrate 15 having a first surface 15*a* and a second surface 15*b* opposite to the first surface 15*a*, and a first light-emitting portion 11 and a second light-emitting portion 12 disposed adjacent to each other on the second surface 15*b* of the support substrate 15, the first light-emitting portion 11 including a semiconductor layered body including a first semiconductor layer 111, a light-emitting layer 112, and a second semiconductor layer 113 in this order and the second light-emitting portion 12 including a semiconductor layered body including a first semiconductor layer 121, a light-emitting layer 122, and a second semiconductor layer 123 in this order; a wavelength conversion member 20 disposed on the first surface 15*a* of the support substrate 15 and containing a phosphor that performs wavelength conversion of first light emitted from the first light-emitting portion 11 and second light emitted from the second light-emitting portion 12 into third light; and a light adjustment member 30 disposed on a surface of the wavelength conversion member 20 (that is, a first surface 20*a* of the wavelength conversion member 20) opposite to a surface on the support substrate 15 side (that is, a second surface 20*b* of the wavelength conversion member 20) and overlapping one of the first light-emitting portion 11 and the second light-emitting portion 12 in plan view. In the light-emitting element 10, the emission intensity of the first light at a light emission peak wavelength of the second light is lower than the emission intensity of the second light at the light emission peak wavelength of the second light, during light emission of the light-emitting device 100.

In one example, the light-emitting device 100 described below further includes a light guide member 40 covering side surfaces of the support substrate 15, a wiring substrate 50 provided with the light-emitting element 10, and a covering member 60 covering side surfaces of the light-emitting element 10 and side surfaces of the wavelength conversion member 20 via the light guide member 40. Components of the light-emitting device 100 will be described below.

Light-Emitting Element

The light-emitting element 10 includes a plurality of light-emitting portions. Specifically, the light-emitting element 10 includes the support substrate 15, the first light-emitting portion 11 and the second light-emitting portion 12 disposed adjacent to each other on the second surface 15*b* of the support substrate 15, a first element electrode 16 disposed on the first light-emitting portion 11, and a second element electrode 17 disposed on the second light-emitting portion 12. The first light is emitted from the first light-emitting portion 11 of the light-emitting element 10, and the second light is emitted from the second light-emitting portion 12 of the light-emitting element 10.

Examples of the support substrate 15 include an insulating substrate made of sapphire, spinel ($MgAl_2O_4$), or the like, and a nitride-based semiconductor substrate made of InN, GaN, InGaN, AlGaN, InGaAlN, or the like. Preferably, the support substrate 15 is made of a light-transmitting material in order to extract light emitted from the light-emitting portions through the support substrate 15.

Each of the first light-emitting portion 11 and the second light-emitting portion 12 includes a semiconductor layered body. The semiconductor layered body of the first light-emitting portion 11 includes a first semiconductor layer 111, a light-emitting layer 112, and a second semiconductor layer 113 disposed in this order on the support substrate 15. The semiconductor layered body of the second light-emitting portion 12 includes a first semiconductor layer 121, a light-emitting layer 122, and a second semiconductor layer 123 disposed in this order on the support substrate 15. A buffer layer made of AlGaN or the like may be provided between the support substrate 15 and the semiconductor layered bodies. The first light-emitting portion 11 and the second light-emitting portion 12 are disposed adjacent to each other with a gap therebetween on the second surface **15*b* of the support substrate 15. The first light-emitting portion 11 and the second light-emitting portion 12 are each provided, on the semiconductor layered body side, with an element electrode for feeding power from the outside. On the first light-emitting portion 11, three element electrodes of an N-side electrode 161, a P-side electrode 162, and an N-side electrode 163 are disposed as the first element electrode 16. Similarly, on the second light-emitting portion 12, three element electrodes of an N-side electrode 171, a P-side electrode 172, and an N-side electrode 173 are disposed as the second element electrode 17. In the light-emitting element 10, the first light-emitting portion 11 and the second light-emitting portion 12 are spaced apart and electrically independent from each other. Therefore, the first light-emitting portion 11 and the second light-emitting portion 12 can be driven individually by being fed with power via the first element electrode 16 and the second element electrode 17**, respectively.

For the first light-emitting portion 11 and the second light-emitting portion 12, materials that emit light with any wavelength can be selected according to the application. For example, the first light-emitting portion 11 and/or the second light-emitting portion 12 that emit blue light (for example, with a wavelength in a range from 430 nm to 500 nm) and green light (for example, with a wavelength in a range from 500 nm to 570 nm) can use the semiconductor layered body formed using a nitride-based semiconductor ($In_XAl_YGa_{1-X-Y}N$, $0 \leq X$, $0 \leq Y$, $X+Y \leq 1$), GaP, or the like. The first light-emitting portion 11 and/or the second light-emitting portion 12 that emit red light (for example, with a wavelength in a range from 610 nm to 700 nm) can use the semiconductor layered body formed using GaAlAs, AlInGaP, or the like as well as the nitride-based semiconductor element. The first light-emitting portion 11 and the second light-emitting portion 12 may have the same semiconductor layered body structure or different semiconductor layered body structures.

During light emission of the light-emitting device 100, the first light and the second light with different emission intensities can be emitted from the first light-emitting portion 11 and the second light-emitting portion 12, respectively, in the light-emitting element 10.

An example of the light-emitting element including the first light-emitting portion 11 and the second light-emitting portion 12 having different light emission intensities during light emission is the light-emitting element 10 including the first light-emitting portion 11 and the second light-emitting portion 12 including different semiconductor layered bodies. Even when the first light-emitting portion 11 and the second light-emitting portion 12 include the same semiconductor layered body in the light-emitting element 10, current densities of an electric current passing through the light-emitting layer 112 of the first light-emitting portion 11 and an electric current passing through the light-emitting layer 122 of the second light-emitting portion 12 are made to be different from each other, whereby light emission intensities of the first light-emitting portion 11 and the second light-emitting portion 12 during light emission of the light-emitting device 100 can be different from each other. Here, in the light-emitting element 10, the first light-emitting portion 11 and the second light-emitting portion 12 include the same semiconductor layered body structure. The light-emitting element 10 receives power during light emission of the light-emitting device 100 such that the current density of the electric current passing through the light-emitting layer 122 of the second light-emitting portion 12 is higher than the current density of the electric current passing through the light-emitting layer 112 of the first light-emitting portion 11.

The first light-emitting portion 11 emits first light. The second light-emitting portion 12 emits second light having an emission intensity at a light emission peak wavelength different from that of the first light. In the light-emitting element 10, the emission intensity of the first light at a light emission peak wavelength of the second light is lower than the emission intensity of the second light at the light emission peak wavelength of the second light, during light emission of the light-emitting device 100. For example, when the light emission peak wavelength of the second light is 439 nm, the emission intensity of the first light is lower than the emission intensity of the second light at a wavelength of 439 nm. Different emission intensities of the first light and the second light can provide a difference in luminance between the first light-emitting portion 11 side and the second light-emitting portion 12 side of the light-emitting surface of the light-emitting device 100. Therefore, in using the light-emitting device 100 as, for example, a light source for an automobile headlight, the luminance can be adjusted according to the irradiation area of the headlight, even with a relatively simple optical system configuration.

In the light-emitting device 100, one light-emitting element 10 includes the first light-emitting portion 11 and the second light-emitting portion 12 that emit light having different light emission intensities. This enables miniaturization of the light-emitting device 100 compared with the light-emitting device in which a plurality of light-emitting elements is combined to provide a luminance difference on a light-emitting surface. For example, when the light-emitting device 100 is used as a light source of an automobile headlight, the optical components such as a lens, a reflector, and the like can be reduced in size by making the light-emitting surface smaller; thus, a more compact headlight can be achieved and the degree of design freedom can be improved.

The light emission peak wavelength of the first and second light during light emission is, for example, in a range from 420 nm to 460 nm. The emission spectra of the first light and the second light partially overlap each other, but the light emission peak wavelengths thereof are different. The difference between the light emission peak wavelengths of the first light and the second light during light emission is preferably in a range from 0.1 nm to 15 nm. With a difference in the light emission peak wavelength being 0.1 nm or more, it is easier to provide a difference in luminance. On the other hand, when the difference between the light emission peak wavelengths is equal to or less than 15 nm, uneven chromaticity on the light-emitting surface of the light-emitting device 100 during light emission can be more easily suppressed by the light adjustment member 30 described later. In the light-emitting device 100, when the emission intensity of the second light during light emission is 100, the emission intensity of the first light is, for example, in a range from 0 to 80, and preferably in a range from 10 to 70. When the emission intensity of the first light is equal to or higher than 10, the difference in chromaticity on the light-emitting surface of the light-emitting device 100 can be more easily controlled. On the other hand, with an emission intensity of the first light being equal to or less than 70, it is easier to provide a difference in luminance on the light-emitting surface.

The first light-emitting portion 11 and the second light-emitting portion 12 have the same area in plan view. The first light-emitting portion 11 and the second light-emitting portion 12 have different current densities during light emission. With different current densities of the first light-emitting portion 11 and the second light-emitting portion 12 during light emission in the light-emitting device 100, the light emission intensities of the first light and the second light are different from each other.

As will be described later, the current densities of the first light-emitting portion 11 and the second light-emitting portion 12 during light emission can be different by individually driving the first light-emitting portion 11 and the second light-emitting portion 12 via a wiring 52 of the wiring substrate 50.

During light emission, the current density of the first light-emitting portion 11 is lower than the current density of the second light-emitting portion 12 in the light-emitting device 100. This makes the emission intensity of the second light emitted from the second light-emitting portion 12 higher than the emission intensity of the first light emitted from the first light-emitting portion 11. Therefore, it is easier for the light-emitting device 100 to have a difference in luminance. Specifically, the current density during light emission of the first light-emitting portion 11 is in a range from 0 $A/m^2$ to $1.9\times10^6$ $A/m^2$, and the current density during light emission of the second light-emitting portion 12 is higher than the current density during light emission of the first light-emitting portion 11 and in a range from $1.7\times10^6$ $A/m^2$ to $2.8\times10^6$ $A/m^2$.

Wavelength Conversion Member

The light-emitting device 100 includes the wavelength conversion member 20 disposed on the first surface 15*a* of the support substrate 15 and containing a phosphor that performs wavelength conversion of the first light emitted from the first light-emitting portion 11 and the second light emitted from the second light-emitting portion 12 into the third light.

The wavelength conversion member 20 converts the wavelength of at least a part of light from the light-emitting element 10 into a different wavelength. In one example, the wavelength conversion member 20 as used herein has a plate shape and is rectangular in plan view. The wavelength conversion member 20 contains a phosphor that performs wavelength conversion of the first light and the second light into the third light having a light emission peak wavelength different from that of the first light and the second light. The light emission peak wavelength of the third light is in a range from 500 nm to 600 nm.

The wavelength conversion member 20 includes a wavelength conversion layer 21 containing a phosphor and a light-transmissive member 22 supporting the wavelength conversion layer 21, and the wavelength conversion layer 21 is disposed facing the first surface 15*a* of the support substrate 15. The wavelength conversion member 20 has a surface larger than the first surface 15*a* of the support substrate 15, and this surface is bonded to the first surface 15*a* of the support substrate 15. That is, the outer edge of the wavelength conversion member 20 is on the outer side of the outer edge of the light-emitting element 10 in plan view.

The wavelength conversion layer 21 can be formed by mixing a phosphor and a light-transmissive material, such as a resin, glass, an inorganic material, or the like, as a binder, and molding the mixture. For example, as the light-transmissive material, an organic resin material such as an epoxy resin, a silicone resin, a phenol resin, or a polyimide resin, as well as an inorganic material such as glass or a ceramic can be used.

As the phosphor, one that can be excited by the first light and the second light emitted from the first light-emitting portion 11 and the second light-emitting portion 12, respectively, can be used.

Examples of a phosphor that emits green light include an yttrium-aluminum-garnet-based phosphor (for example, $Y_3(Al,Ga)_5O_{12}$:Ce), a lutetium-aluminum-garnet-based phosphor (for example, $Lu_3(Al,Ga)_5O_{12}$:Ce), a terbium-aluminum-garnet-based phosphor (for example, $Tb_3(Al,Ga)_5O_{12}$:Ce), a silicate-based phosphor (for example, $(Ba,Sr)_2SiO_4$:Eu), a chlorosilicate-based phosphor (for example, $Ca_8Mg(SiO_4)_4Cl_2$:Eu), a β-sialon-based phosphor (for example, $Si_{6-z}Al_zO_zN_{8-z}$:Eu ($0<z<4.2$)), and an SGS-based phosphor (for example, $SrGa_2S_4$:Eu).

Examples of a phosphor that emits yellow light include an a-sialon-based phosphor (for example, $Mz(Si,Al)_{12}(O,N)_{16}$ (where $0\le z\le 2$, and M is Li, Mg, Ca, or Y, and a lanthanide element excluding La and Ce). In addition, the above phosphors that emit green light include a phosphor that emits yellow light. For example, when Y is partially substituted with Gd in the yttrium aluminum garnet-based phosphor, a light emission peak wavelength can be shifted to a long wavelength side, and thus, the yttrium aluminum garnet-based phosphor can emit yellow light. Further, the above phosphors include a phosphor that can emit orange light.

Examples of a phosphor that emits red light include a nitrogen-containing calcium aluminosilicate (CASN or SCASN)-based phosphor (for example, $(Sr,Ca)AlSiN_3$:Eu) and a BSESN-based phosphor (for example, $(Ba,Sr,Ca)_2Si_5N_8$:Eu). Other examples include a manganese-activated fluoride-based phosphor (a phosphor represented by a general formula (I) $A_2[M_{1-n}Mn_aF_6]$ (where, in the general formula (I), A is at least one kind of element selected from the group consisting of K, Li, Na, Rb, Cs, and $NH_4$, M is at least one kind of element selected from the group consisting of Group 4 elements and Group 14 elements, and a satisfies $0<a<0.2$)). Examples of the manganese-activated fluoride-based phosphor include a KSF-based phosphor (for example, $K_2SiF_6$:Mn), a KSAF-based phosphor (for example, $K_2Si_{0.99}Al_{0.01}F_{5.99}$:Mn), and an MGF-based phosphor (for example, 3.5MgO0.5MgF2GeO2:Mn).

For example, an yttrium-aluminum-garnet-based phosphor (for example, $(Y,Gd)_3Al_5O_{12}$:Ce) in which Y is partially substituted with Gd can be preferably used as a yellow light-emitting phosphor that can emit white mixed-color light in combination with a blue light-emitting element. To obtain the light-emitting device 100 that can emit white light, the kind and concentration of the phosphor that is contained in the wavelength conversion layer 21 are adjusted such that the light-emitting device 100 can emit white light of a desired chromaticity rank.

The phosphor concentration of the wavelength conversion layer 21 is preferably set in accordance with the second light having a high emission intensity that is emitted from the second light-emitting portion 12. Specifically, it is preferably set in accordance with the peak wavelength during light emission of the second light. For example, the kind, particle size, and concentration of the phosphor to be contained are determined in accordance with the peak wavelength of the second light that is emitted with a desired emission intensity, in consideration of a wavelength conversion efficiency with which the phosphor is excited at the peak wavelength, an emission wavelength, and the like. The phosphor concentration in the wavelength conversion layer 21 is preferably, for example, in a range from 60 mass % to 70 mass %. The phosphor concentration refers to the proportion of the phosphor in the wavelength conversion layer 21 containing the phosphor.

The light-transmissive member 22 is made of, for example, a light-transmissive material such as a resin, glass, or an inorganic material molded into a plate shape. The light-transmissive member 22 has a size equivalent to that of the wavelength conversion layer 21 in plan view and is disposed such that its lower surface is in contact with the upper surface of the wavelength conversion layer 21. As for the glass, borosilicate glass, quartz glass, and the like, for example, can be used. As for the resin, a silicone resin, an epoxy resin, and the like, for example, can be used. In particular, it is preferable to use glass for the light-transmissive member 22 in consideration of its resistance to degradation by light, mechanical strength, and the like. The light-transmissive member 22 may contain a light diffusion member. With the light diffusion member contained in the light-transmissive member 22, uneven chromaticity and uneven luminance can be suppressed. As for the light diffusion member, titanium oxide, barium titanate, aluminum oxide, or silicon oxide, for example, can be used. An example of the wavelength conversion member 20 is formed by disposing the wavelength conversion layer 21 by printing or the like on the light-transmissive member 22 made of a glass plate. Supported by the glass plate, the wavelength conversion layer 21 can be made thinner. This shortens the optical path length of light passing through the wavelength conversion layer 21 and suppresses light attenuation in the wavelength conversion layer 21, so that the light-emitting device 100 can have a higher luminance. In addition, disposing the glass on the light-emitting surface side of the light-emitting device 100 can reduce the surface unevenness of the light-transmissive member 22; thus, the light adjustment member 30 can be disposed easily.

The thickness of the wavelength conversion member 20 can be set, for example, in a range from 100 μm to 300 μm, preferably in a range from 150 μm to 250 μm, in consideration of the miniaturization of the light-emitting device 100, the mechanical strength of the wavelength conversion member 20, and the like. When the wavelength conversion member 20 includes the wavelength conversion layer 21 and the light-transmissive member 22, the thickness of the wavelength conversion layer 21 is preferably about 20% to 60% of the total thickness of the wavelength conversion member 20.

Light Adjustment Member

The light-emitting device 100 includes the light adjustment member 30 that is disposed on the surface 20*a* of the wavelength conversion member 20 (hereinafter referred to as the first surface 20*a* of the wavelength conversion member 20) opposite to the surface 20*b* on the support substrate side (hereinafter referred to as the second surface 20*b* of the wavelength conversion member 20), and overlaps one of the first light-emitting portion 11 and the second light-emitting portion 12 in plan view. For example, the light adjustment member 30 reflects light with a specific wavelength and transmits light with the other wavelengths. That is, the light adjustment member 30 is an optical member having both reflective and transmissive optical properties. This allows adjustment of the chromaticity of light emitted from the light-emitting device 100. The light adjustment member 30 may reflect all or a part of the light with a specific wavelength. The light adjustment member 30 is a member that reflects the third light and transmits the first light. The light adjustment member 30 is, for example, a dielectric multilayer film. As used herein, the light adjustment member 30 transmits a part of the third light.

As the dielectric multilayer film, a distributed Bragg reflector (DBR) film, for example, may be used. Specifically, it is a film obtained by alternately layering two or more kinds of dielectric films having different refractive indices at a thickness of the wavelength divided by 4n (n is a refractive index), and it can highly efficiently reflect light with a predetermined wavelength. The dielectric film is made of, for example, silicon oxide, niobium oxide, aluminum oxide, titanium oxide, zirconium oxide, tantalum oxide, or the like. The dielectric multilayer film is formed by, for example, alternately layering a silicon oxide film and a niobium oxide film. The thicknesses and materials of a low refractive index layer and a high refractive index layer may be changed, for example, to control the reflectance and/or transmittance.

In the present embodiment, the refractive index of the low refractive index layer is preferably in a range from 1.2 to 1.6, and the refractive index of the high refractive index layer is preferably in a range from 2.0 to 2.6. When these two layers are layered as a set, ten or more sets are preferably used to form the dielectric multilayer film. In terms of interference of light (especially when lights cancel each other), the relationship of $2nd=\lambda/2$ is satisfied, where n is a refractive index, d is a thickness, and λ is a wavelength. The film thicknesses of the low refractive index layer and the high refractive index layer can be defined according to the relationship. Specifically, when the refractive index of silicon oxide is 1.46, the refractive index of niobium oxide is 2.25, and the wavelength desired to be cut is 600 nm (±100 nm), the thickness of a single silicon oxide film is, for example, 103 nm, and the thickness of a single niobium oxide film is, for example, 67 nm.

The light adjustment member 30 is disposed overlapping the first light-emitting portion 11 in plan view. When the light adjustment member 30 is disposed overlapping, in plan view, the first light-emitting portion 11 that emits the first light, it is possible to suppress emission, from the light-emitting device 100, of the third light obtained by wavelength conversion of the first light and the third light obtained by wavelength conversion of the second light on the first light-emitting portion 11 side. This can decrease a difference in chromaticity between light emitted from the first light-emitting portion 11 side and the light emitted from the second light-emitting portion 12 side. This allows the light-emitting device 100 to improve uneven chromaticity of the emission color on the light-emitting surface.

The light adjustment member 30 is preferably disposed overlapping the entire first light-emitting portion 11 in plan view. This can further suppress the emission of the third light obtained by wavelength conversion of the first light, from the light-emitting device 100. However, the light adjustment member 30 may include a portion that does not overlap the first light-emitting portion 11 in plan view as long as an effect of adjusting the chromaticity to a desired chromaticity can be obtained.

Preferably, the light adjustment member 30 is disposed overlapping the first light-emitting portion 11 in plan view, and extends to a position near the center of a portion between the first light-emitting portion 11 and the second light-emitting portion 12. This can further suppress the emission, from the light-emitting device 100, of the third light obtained by wavelength conversion of the first light and the third light obtained by wavelength conversion of the second light on the first light-emitting portion 11 side.

Light Guide Member

The light-emitting device 100 may include the light guide member 40 that covers the side surfaces of the light-emitting element 10. The light guide member 40 is a member that guides light from the light-emitting element 10 to the wavelength conversion member 20. The light guide member 40 covers the side surfaces of the support substrate 15. The light guide member 40 may be made of, for example, an adhesive member that bonds the light-emitting element 10 and the wavelength conversion member 20 and extends to the side surfaces of the support substrate 15. In this case, the light guide member 40 may be disposed with a predetermined thickness between the support substrate 15 and the wavelength conversion member 20. The light guide member 40 may be a member different from the adhesive member bonding the light-emitting element 10 and the wavelength conversion member 20.

In one example, the light guide member 40 has a curved side surface in a cross-sectional view. The light guide member 40 may be shaped with sloping side surfaces in cross-sectional view such that the width of the light guide member 40 increases from the second surface **15*b* side of the support substrate 15 toward the second surface 20*b* side of the wavelength conversion member 20. The cross-sectional shape of the side surface of the light guide member 40 may be straight or curved. For example, when the side surface of the light guide member 40 in cross-sectional view has a curved shape, the curved shape may be recessed toward the covering member 60, which will be described later, or toward the support substrate 15. Furthermore, the curved shape may include a portion recessed toward the covering member 60 and a portion recessed toward the support substrate 15**.

For example, a light-transmissive resin can be employed for the light guide member 40. The light guide member 40 may be made of an organic resin such as an epoxy resin, a silicone resin, a phenolic resin, or a polyimide resin. In particular, a silicone resin, which has a high heat resistance, is preferably employed. The above-described light diffusion member or phosphor can also be contained in the light guide member 40.

Wiring Substrate

In the light-emitting device 100, the light-emitting element 10 can be disposed on the wiring substrate 50. The wiring substrate 50 includes a base body 51 and the wiring 52 that is disposed on an upper surface of the base body 51 and feeds power to the first element electrode 16 and the second element electrode 17 of the light-emitting element 10 via a conductive member 70. The first element electrode 16 and the second element electrode 17 are disposed over the wiring 52 with the conductive member 70 therebetween. The conductive member 70 can be formed using a metal material made of a conductive metal, such as Cu or Au, or an alloy of such a metal. The element electrodes of the light-emitting element 10 and the wiring 52 may be directly bonded to each other without the conductive member 70 interposed therebetween.

The wiring substrate 50 includes the wiring 52 that can individually drive the first light-emitting portion 11 and the second light-emitting portion 12. The wiring 52 includes, for example, a first wiring 521, a second wiring 522, and a third wiring 523 for driving the first light-emitting portion 11, and a fourth wiring 524, a fifth wiring 525, and a sixth wiring 526 for driving the second light-emitting portion 12. The first wiring 521 and the third wiring 523 are connected by a wire 53, and the fourth wiring 524 and the sixth wiring 526 are connected by a wire 54. The second wiring 522 and the third wiring 523 are provided with an electronic component 541 such as a protective element, and the fifth wiring 525 and the sixth wiring 526 are provided with an electronic component 542. With the wiring 52, the wiring substrate 50 can individually control the amount of electric current that is fed to the first light-emitting portion 11 and the amount of electric current that is fed to the second light-emitting portion 12.

For the base body 51, any material known in the art can be used as the base body that is included in the wiring substrate for supporting electronic components such as the light-emitting element. For example, an insulating material such as glass epoxy, a resin, or a ceramic, a semiconductor material such as silicon, and a conductive material such as copper can be used. In particular, a ceramic, which has high heat resistance and light resistance, can be preferably used. Examples of a ceramic include aluminum oxide, aluminum nitride, silicon nitride, LTCC, and the like. In addition, a composite material of such an insulating material, a semiconductor material, and a conductive material can also be used. In a case in which the base body 51 is formed using a semiconductor material or a conductive material, the wiring 52 can be disposed over the upper surface of the base body 51 with an insulating layer therebetween.

Examples of the material for the wiring 52 include metals such as Fe, Cu, Ni, Al, Ag, Au, Pt, Ti, W, and Pd, and alloys containing at least one kind of these metals.

Covering Member

The light-emitting device 100 can include the covering member 60 that covers the light-emitting element 10 and the wavelength conversion member 20.

The covering member 60 is disposed covering the side surfaces of the first element electrode 16 and the second element electrode 17 and the side surfaces of the wavelength conversion member 20. In a case in which the light-emitting device 100 includes the light guide member 40, the covering member 60 covers the side surfaces of the light-emitting element 10 via the light guide member 40. In a case in which the light-emitting element 10 is disposed on the wiring substrate 50, the covering member 60 may cover the upper surface of the wiring substrate 50.

Preferably, the covering member 60 has a light-blocking property, specifically, a light reflective property and/or a light absorbing property. In particular, a material that can reflect light emitted from the light-emitting element 10 is preferably contained in the covering member 60. For example, the material preferably has a reflectance of 60% or more, more preferably 70% or more, 80% or more, or 90% or more with respect to the first light and the second light emitted from the light-emitting element 10. Preferably, the covering member 60 is formed using an insulating material. For example, a thermosetting resin, a thermoplastic resin, or the like can be used for the covering member 60. Specifically, an example of the covering member 60 is a resin containing particles of a light reflective substance. Examples of a resin include a resin containing at least one of a silicone resin, a modified silicone resin, an epoxy resin, a modified epoxy resin, an acrylic resin, a phenol resin, a bismaleimide triazine resin, and a polyphthalamide resin, and a hybrid resin thereof. Among these materials, it is preferable to use a resin containing, as a base polymer, a silicone resin, which exhibits a good heat resistance property and electrically insulating property and has flexibility. Examples of the light reflective material include titanium oxide, silicon oxide, zirconium oxide, magnesium oxide, calcium carbonate, calcium hydroxide, calcium silicate, zinc oxide, barium titanate, potassium titanate, aluminum oxide, aluminum nitride, boron nitride, and mullite, and a combination thereof. Among these materials, titanium oxide is preferable because it is relatively stable with respect to moisture or the like and has a high refractive index.

Operation of Light-Emitting Device

Upon activation of the light-emitting device 100, an electric current is fed from an external power source to the light-emitting element 10, and the light-emitting element 10 emits light. At least a part of each of the first light and the second light emitted from the light-emitting element 10 is subjected to wavelength conversion into the third light by the wavelength conversion member 20. The third light is mixed with the first light and the second light that are not subjected to wavelength conversion into the third light, and is emitted to the outside as, for example, white light. Light traveling in a lateral direction from the light-emitting element 10 is reflected by the covering member 60, enters the wavelength conversion member 20, and is emitted to the outside. At this time, the emission intensities of the first light and the second light are different, as described above, and the phosphor concentration of the wavelength conversion layer 21 is set in accordance with the second light having a high emission intensity that is emitted from the second light-emitting portion 12. In other words, the phosphor concentration of the wavelength conversion layer 21 is higher than the phosphor concentration set in accordance with the first light such that a desired white color can be achieved. This increases the proportion, in the wavelength conversion member 20, of the third light that is emitted from the first light-emitting portion 11 side. Since the light adjustment member 30 is disposed overlapping the first light-emitting portion 11 in plan view, the light amount of the third light that is emitted from the first light-emitting portion 11 side in plan view can be adjusted. This can reduce a difference in chromaticity between light emitted from the first light-emitting portion 11 side and light emitted from the second light-emitting portion 12 side, improving uneven chromaticity on the light-emitting surface of the light-emitting device 100.

By referring to FIGS. 2A and 2B, improvement of uneven chromaticity of the emission color by the light adjustment member 30 will be specifically described below. For the sake of simplicity of the description, only some optical paths are schematically illustrated in FIGS. 2A and 2B. Although the traveling direction of the actual light appropriately changes due to refraction, scattering, or the like between and inside the members, illustration thereof may be omitted for simplicity. The light emission peak wavelength of light that is emitted from the light-emitting layer is shifted according to the magnitude of the value of electric current flowing through the light-emitting layer. For example, the light emission peak wavelength is shifted to the short wavelength side in response an increase in the current value. Therefore, even when the same semiconductor layered body is used for the first light-emitting portion 11 and the second light-emitting portion 12, different values of electric current fed to the first light-emitting portion 11 and the second light-emitting portion 12 cause a difference in excitation efficiency of the phosphor due to different light emission peak wavelengths, thus causing a difference in chromaticity of the emission color.

For the light emission peak wavelengths of the first light and the second light (for example, blue light) emitted from the first light-emitting portion 11 and the second light-emitting portion 12, respectively, the light emission peak wavelength of first light L1B1 having a low emission intensity is longer than that of second light L2B1 having a high emission intensity, for example. In this case, for the light emission peak wavelength of light obtained by wavelength conversion (for example, yellow light), the light emission peak wavelength of third light L1Y11 obtained by wavelength conversion of the first light L1B1 is longer than that of third light L2Y11 obtained by wavelength conversion of the second light L2B1. The phosphor concentration of the wavelength conversion layer 21 is set in accordance with the second light L2B1 having a high emission intensity that is emitted from the second light-emitting portion 12. Therefore, the phosphor concentration is high for the first light L1B1, causing a larger part of the first light L1B1 to be easily subjected to wavelength conversion into the third light L1Y11.

With the light adjustment member 30 disposed overlapping the first light-emitting portion 11 in plan view, on the first light-emitting portion 11 side, a part of the third light L1Y11 obtained by wavelength conversion of the first light L1B1 traveling upward is reflected by the light adjustment member 30 to become third light L1Y12, while another part of the third light L1Y11 is transmitted through the light adjustment member 30 to become third light L1Y13 and the third light L1Y13 is emitted from the upper surface of the light adjustment member 30. A large part of third light L2Y21 obtained by wavelength conversion of second light L2B2 emitted from the second light-emitting portion 12 and traveling obliquely upward to the first light-emitting portion 11 side is reflected by the light adjustment member 30 to become third light L2Y22, while the remaining part of the third light L2Y21 is transmitted through the light adjustment member 30 to become third light L2Y23 and the third light L2Y23 is emitted from the upper surface of the light adjustment member 30.

On the other hand, on the second light-emitting portion 12 side, the third light L2Y11 is emitted from the upper surface of the wavelength conversion member 20, as it is. Third light L1Y21 obtained by wavelength conversion of first light L1B2 emitted from the first light-emitting portion 11 and traveling obliquely upward to the second light-emitting portion 12 side is emitted from the upper surface of the wavelength conversion member 20, as it is.

At this time, the third light L1Y11 has a longer wavelength (that is, closer to yellow) than the third light L2Y11. Thus, a part of the third light L1Y11 (yellow light) is reflected by the light adjustment member 30 to adjust the chromaticity of light emitted from the first light-emitting portion 11 side. This reduces a difference in chromaticity between light emitted from the first light-emitting portion 11 side and light emitted from the second light-emitting portion 12 side, improving uneven chromaticity of white light having a luminance difference that is emitted from the light-emitting device 100.

Method for Manufacturing Light-emitting Device

Figure 3:
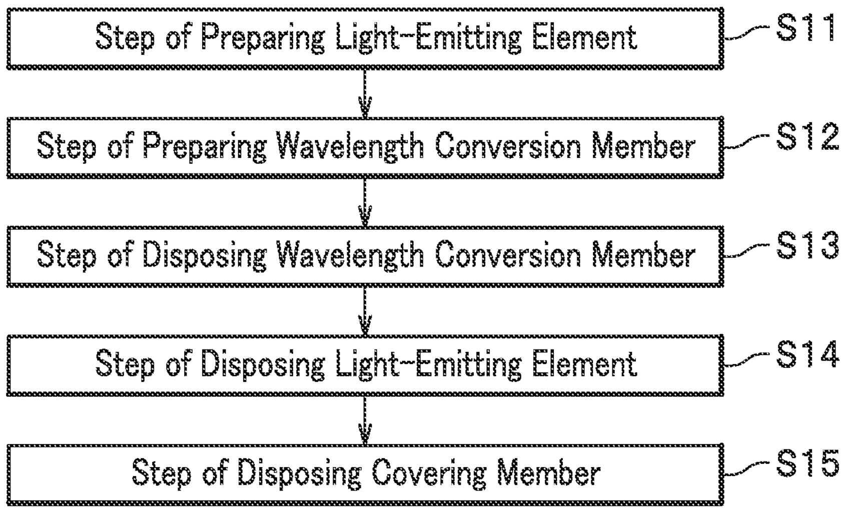
FIG. 3 is a flowchart of a method for manufacturing the light-emitting device according to the first embodiment.
Figure 4A:
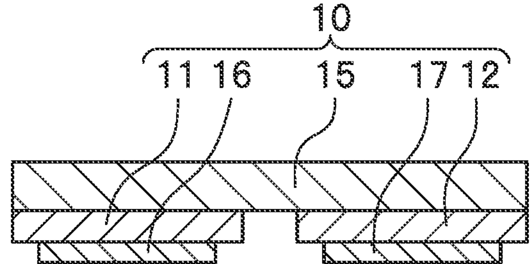
FIG. 4A is a schematic cross-sectional view illustrating an example of the method for manufacturing the light-emitting device according to the first embodiment.
Figure 4B:
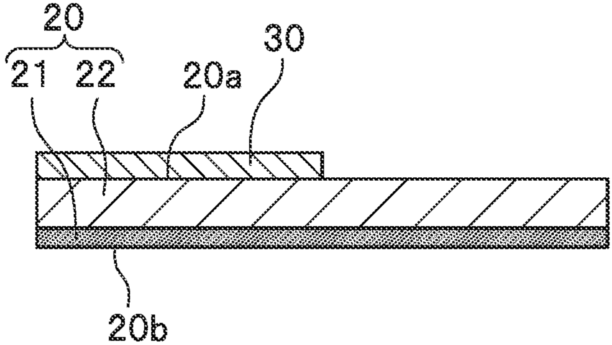
FIG. 4B is a schematic cross-sectional view illustrating an example of the method for manufacturing the light-emitting device according to the first embodiment.
Figure 4C:
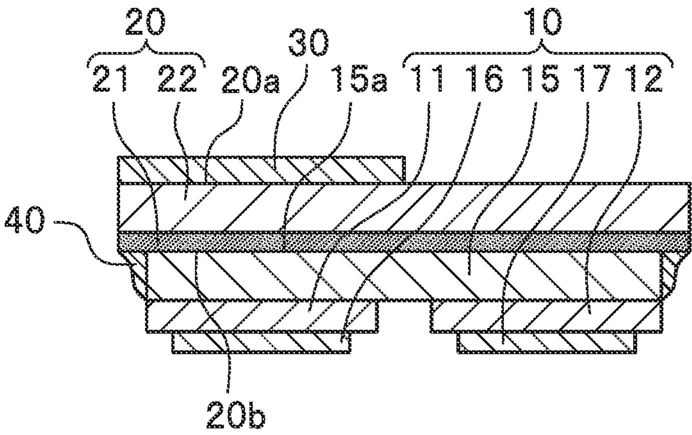
FIG. 4C is a schematic cross-sectional view illustrating an example of the method for manufacturing the light-emitting device according to the first embodiment.
Figure 4D:
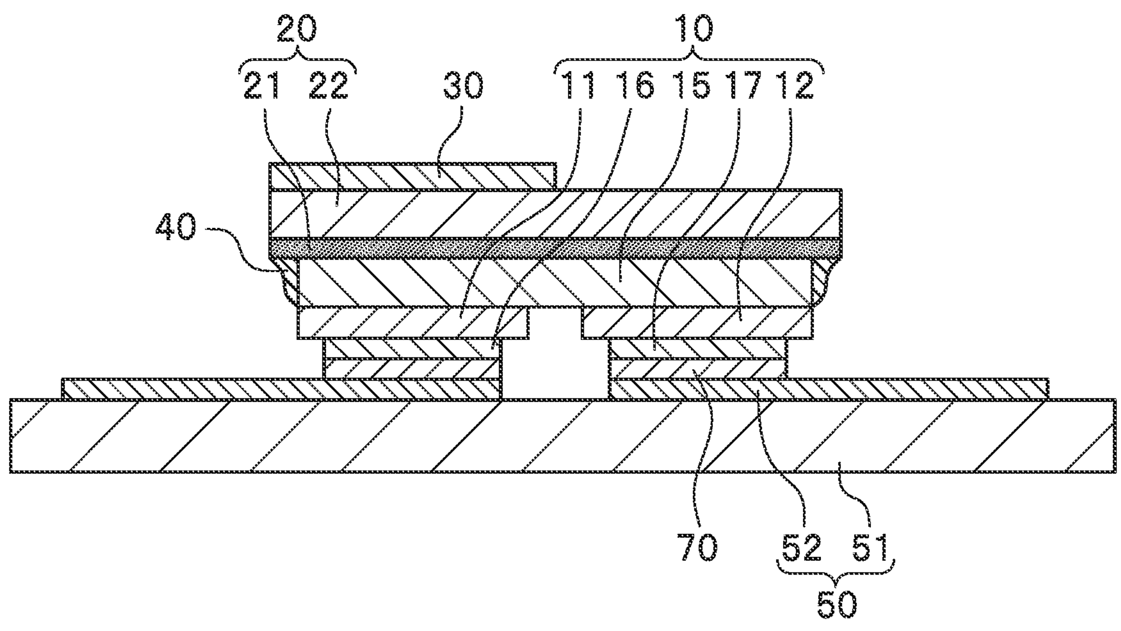
FIG. 4D is a schematic cross-sectional view illustrating an example of the method for manufacturing the light-emitting device according to the first embodiment.
Figure 4E:
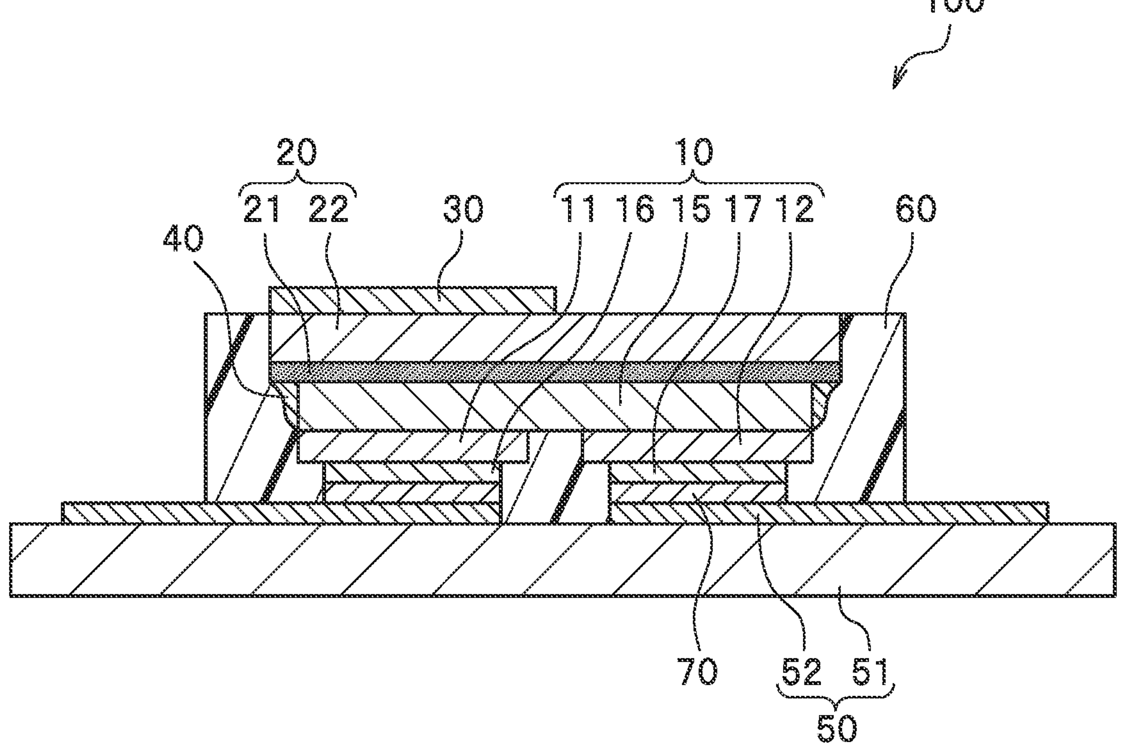
FIG. 4E is a schematic cross-sectional view illustrating an example of the method for manufacturing the light-emitting device according to the first embodiment.

FIG. 3 is a flowchart of a method for manufacturing the light-emitting device according to the first embodiment. FIGS. 4A to 4E are schematic cross-sectional views illustrating an example of the method for manufacturing the light-emitting device according to the first embodiment.

A method for manufacturing the light-emitting device 100 includes a step of preparing the light-emitting element 10 including the support substrate 15 having the first surface 15*a* and the second surface 15*b* opposite to the first surface 15*a*, and the first light-emitting portion 11 and the second light-emitting portion 12 disposed adjacent to each other on the second surface 15*b* of the support substrate 15, the first light-emitting portion 11 including the semiconductor layered body including the first semiconductor layer 111, the light-emitting layer 112, and the second semiconductor layer 113 in this order and the second light-emitting portion 12 including the semiconductor layered body including the first semiconductor layer 121, the light-emitting layer 122, and the second semiconductor layer 123 in this order; a step of preparing the wavelength conversion member 20 having the first surface 20*a* and the second surface 20*b* opposite to the first surface 20*a* and containing a phosphor that performs wavelength conversion of the first light emitted from the first light-emitting portion 11 and the second light emitted from the second light-emitting portion 12 into the third light, the first surface 20*a* of the wavelength conversion member 20 being provided with the light adjustment member 30; and a step of disposing the wavelength conversion member 20 provided with the light adjustment member 30 such that the second surface 20*b* of the wavelength conversion member 20 faces the first surface 15*a* of the support substrate 15. In the step of disposing the wavelength conversion member 20, the wavelength conversion member 20 is disposed on the light-emitting element 10 such that the light adjustment member 30 overlaps one of the first light-emitting portion 11 and the second light-emitting portion 12 in plan view.

The method for manufacturing the light-emitting device 100 is described which includes a step S11 of preparing the light-emitting element, a step S12 of preparing the wavelength conversion member, a step S13 of disposing the wavelength conversion member, a step S14 of disposing the light-emitting element, and a step S15 of disposing the covering member.

Note that the materials, arrangement, and the like of the members are as in the description of the light-emitting device 100, and thus descriptions thereof will be omitted as appropriate.

Step of Preparing Light-Emitting Element

The step S11 of preparing the light-emitting element is a step of preparing the light-emitting element 10 including the support substrate 15, the first light-emitting portion 11, the second light-emitting portion 12, the first element electrode 16, and the second element electrode 17.

Step of Preparing Wavelength Conversion Member

The step S12 of preparing the wavelength conversion member is a step of preparing the wavelength conversion member 20 provided with the light adjustment member 30, by disposing the light adjustment member 30 on the first surface 20*a* of the wavelength conversion member 20. As the light adjustment member 30, for example, a dielectric multilayer film may be formed by layering dielectric films on the first surface 20*a* of the wavelength conversion member 20. Alternatively, the wavelength conversion member 20 provided in advance with the light adjustment member 30 such as a dielectric multilayer film may be purchased, for example. When the wavelength conversion member 20 includes the wavelength conversion layer 21 containing the phosphor and the light-transmissive member 22 supporting the wavelength conversion layer 21, the dielectric multilayer film is preferably disposed on the light-transmissive member 22 being on the first surface 20*a* side.

In the step S12 of preparing the wavelength conversion member, the arrangement, sizes, and the like of the members are adjusted such that, when the wavelength conversion member 20 is disposed on the first surface 15*a* of the support substrate 15, the light adjustment member 30 is disposed overlapping the first light-emitting portion 11 in plan view.

For the step S11 of preparing the light-emitting element and the step S12 of preparing the wavelength conversion member, either of the steps may be performed first, or both the steps may be performed in parallel.

Step of Disposing Wavelength Conversion Member

The step S13 of disposing the wavelength conversion member is a step of disposing the wavelength conversion member 20 provided with the light adjustment member 30, on the first surface 15*a* of the support substrate 15. In the step S13 of disposing the wavelength conversion member, the wavelength conversion member 20 including the wavelength conversion layer 21 containing the phosphor and the light-transmissive member 22 supporting the wavelength conversion layer 21 is disposed such that the surface on the wavelength conversion layer 21 side is located on the first surface 15*a* side of the support substrate 15. In the step S13 of disposing the wavelength conversion member, the wavelength conversion member 20 is disposed such that the light adjustment member 30 overlaps the first light-emitting portion 11 in plan view. The wavelength conversion member 20 is bonded to the support substrate 15 using, for example, an adhesive member. By adjusting the amount of the adhesive member, it is possible to extend the adhesive member provided between the support substrate 15 and the wavelength conversion member 20 to the side surfaces of the support substrate 15 to form the light guide member 40 made of the adhesive member on the side surfaces of the support substrate 15. The wavelength conversion member 20 may be bonded to the support substrate 15 by direct bonding instead of using the adhesive member.

Step of Disposing Light-Emitting Element

The step S14 of disposing the light-emitting element is a step of disposing the light-emitting element 10 on the wiring substrate 50. In the step S14 of disposing the light-emitting element, the light-emitting element 10 is disposed on the wiring substrate 50 by bonding the first element electrode 16 and the second element electrode 17 to the wiring 52 by using the conductive member 70.

Step of Disposing Covering Member

The step S15 of disposing the covering member is a step of disposing, on the wiring substrate 50, the covering member 60 covering the side surfaces of the first element electrode 16 and the second element electrode 17, the side surfaces of the light guide member 40, and the side surfaces of the wavelength conversion member 20.

In the step S15 of disposing the covering member, an uncured resin constituting the covering member 60 is disposed, on the wiring substrate 50, covering the entire side surfaces of the wavelength conversion member 20. To dispose the resin or the like, for example, the resin is fed on the upper side of the wiring substrate 50 that is fixed, by using a resin discharge device that can move (is movable) vertically, horizontally, or the like with respect to the wiring substrate 50. Alternatively, the resin can be disposed by compression molding, transfer molding, or the like. Subsequently, the resin is cured to form the covering member 60. The covering member 60 may be formed by disposing a frame such as a resin wall in advance at a desired position of the wiring substrate 50 and filling the inside of the frame with resin. The upper surface of the formed covering member 60 may be cut to adjust the height or may be flattened, as necessary.

In the method for manufacturing the light-emitting device 100, a plurality of light-emitting devices 100 may be manufactured simultaneously using a single wiring substrate including a plurality of continuous areas, each of which becomes the wiring substrate 50 of the corresponding light-emitting device 100 after separation, or may be manufactured individually. When simultaneously manufacturing the plurality of light-emitting devices 100, the separation step of separating the light-emitting devices 100 is performed after the step S15 of disposing the covering member, to form the light-emitting devices 100.

Next, other embodiments will be described. Note that the same reference signs are attached to the configurations that have been described above, and explanation thereof will be omitted as appropriate.

Second Embodiment

Figure 5A:
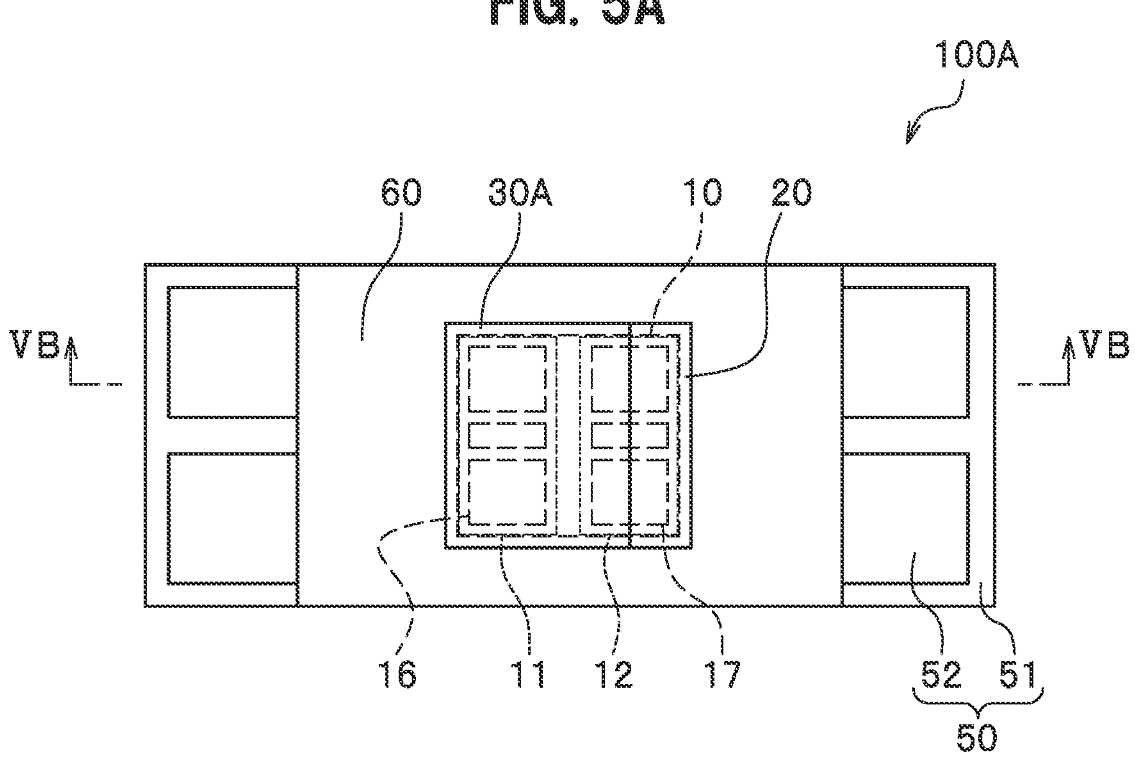
FIG. 5A is a schematic plan view illustrating an example of a light-emitting device according to a second embodiment.
Figure 5B:
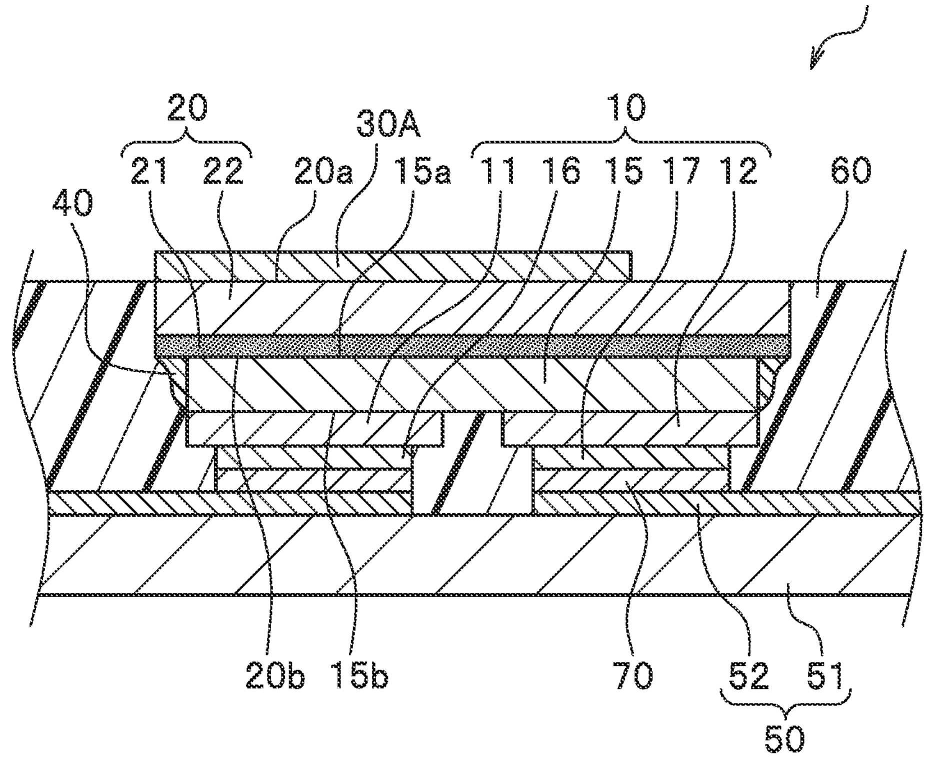
FIG. 5B is a schematic cross-sectional view taken along line VB-VB of FIG. 5A.

FIG. 5A is a schematic plan view illustrating an example of a light-emitting device according to a second embodiment. FIG. 5B is a schematic cross-sectional view taken along line VB-VB of FIG. 5A.

A light-emitting device 100A differs from the light-emitting device 100 according to the first embodiment in that a light adjustment member 30A extends up to a position overlapping a part of the second light-emitting portion 12 in plan view.

The light adjustment member 30A overlaps the first light-emitting portion 11 and extends up to a position overlapping about half the second light-emitting portion 12 in plan view. With this structure, it is possible to further suppress emission, from the light-emitting device 100A, of the third light obtained by wavelength conversion of the first light.

Third Embodiment

Figure 6A:
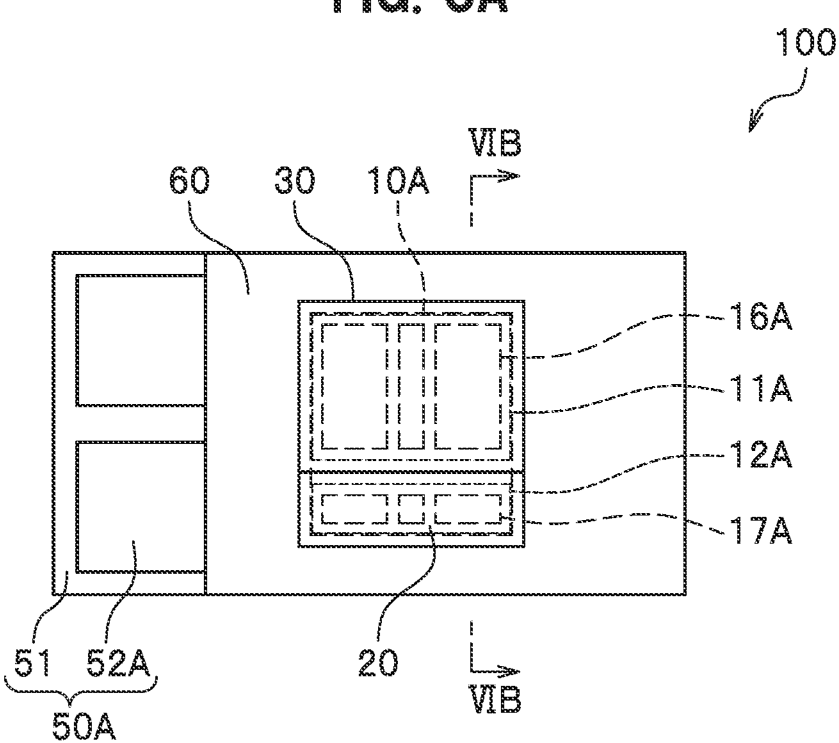
FIG. 6A is a schematic plan view illustrating an example of a light-emitting device according to a third embodiment.
Figure 6B:
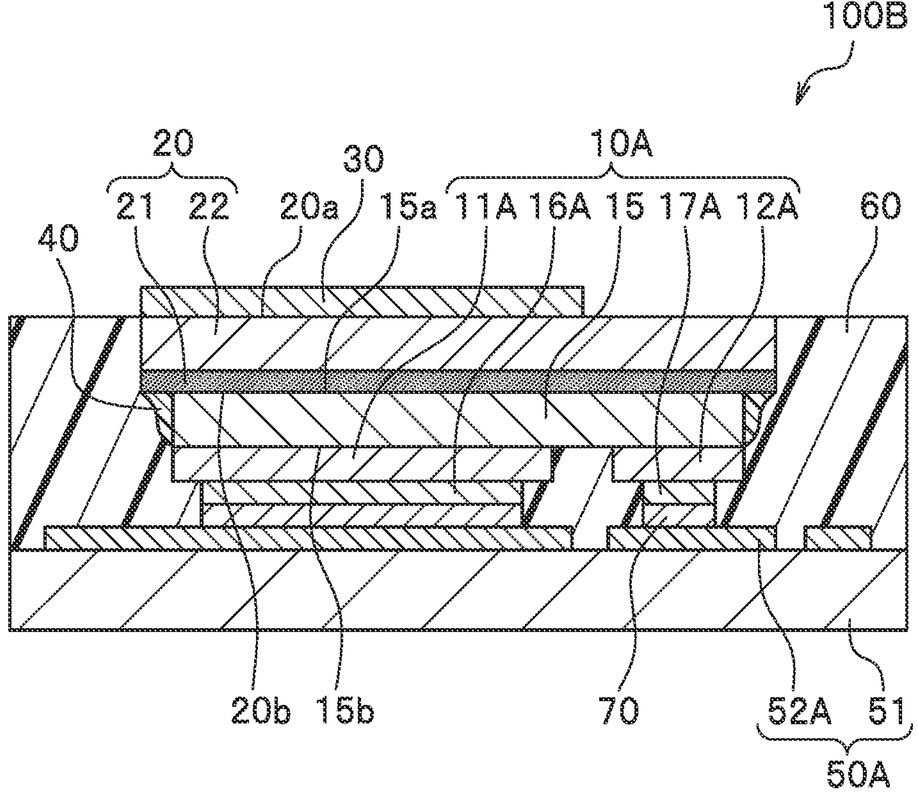
FIG. 6B is a schematic cross-sectional view taken along line VIB-VIB of FIG. 6A.
Figure 6C:
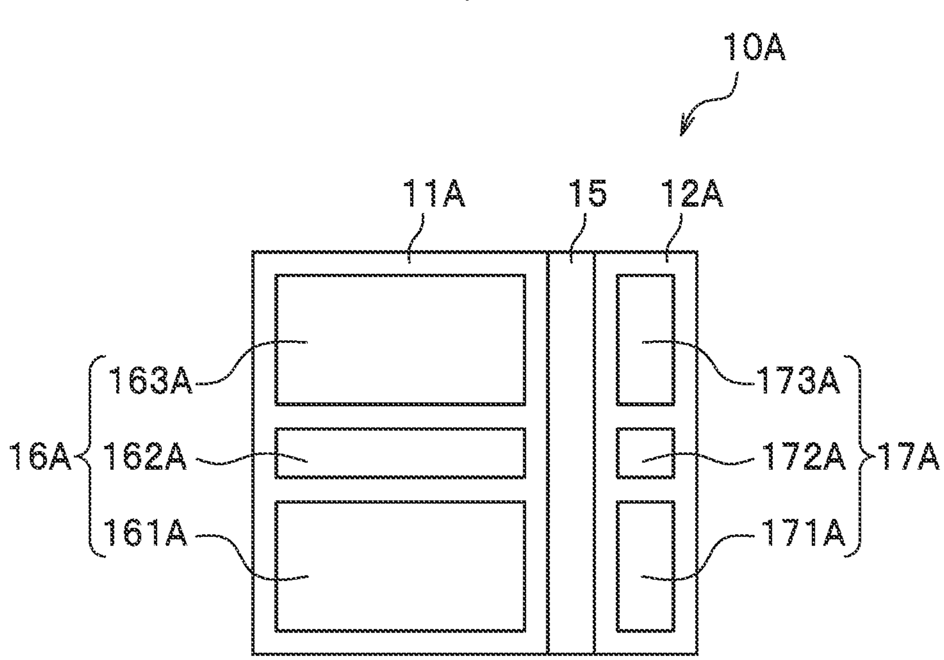
FIG. 6C is a schematic bottom view illustrating an example of a light-emitting element of the light-emitting device according to the third embodiment.
Figure 6D:
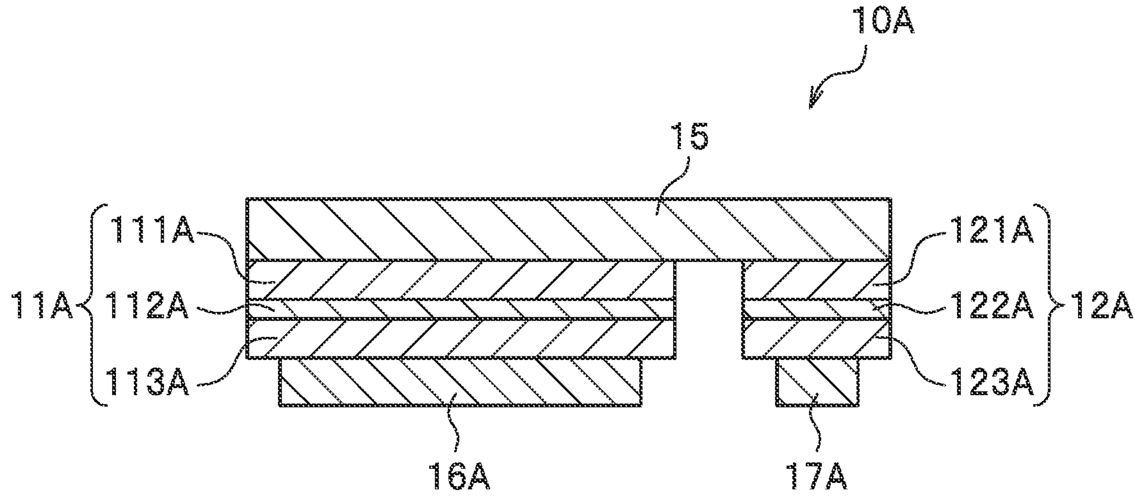
FIG. 6D is a schematic cross-sectional view illustrating an example of the light-emitting element of the light-emitting device according to the third embodiment.
Figure 6E:
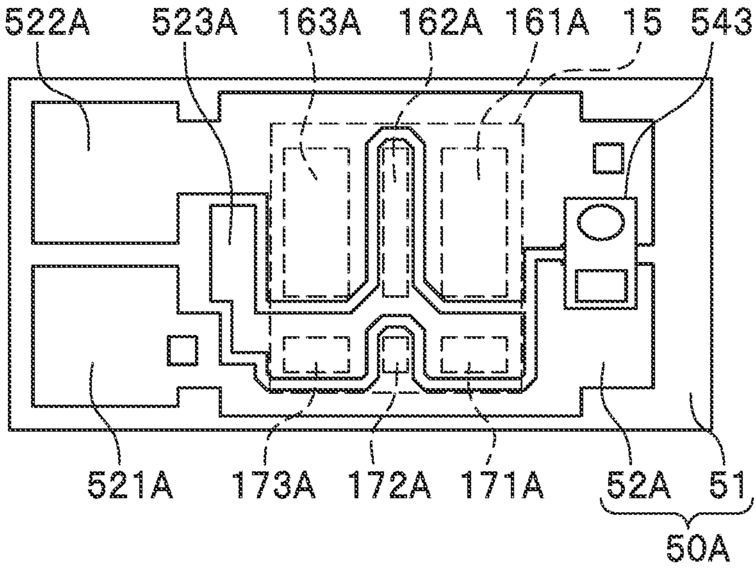
FIG. 6E is a schematic plan view for explaining a wiring substrate of the light-emitting device according to the third embodiment.
Figure 6F:
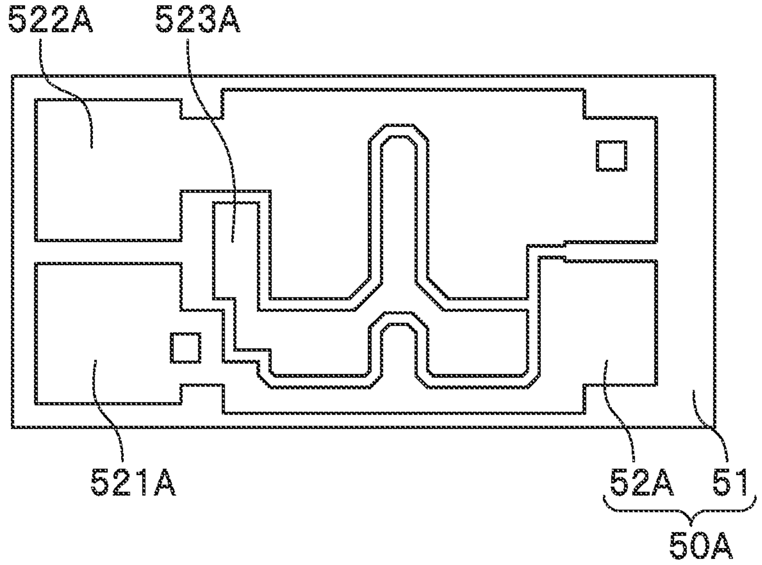
FIG. 6F is a schematic plan view illustrating an example of the wiring substrate of the light-emitting device according to the third embodiment.

FIG. 6A is a schematic plan view illustrating an example of a light-emitting device according to a third embodiment. FIG. 6B is a schematic cross-sectional view taken along line VIB-VIB of FIG. 6A. FIG. 6C is a schematic bottom view illustrating an example of a light-emitting element of the light-emitting device according to the third embodiment. FIG. 6D is a schematic cross-sectional view illustrating an example of the light-emitting element of the light-emitting device according to the third embodiment. FIG. 6E is a schematic plan view for explaining a wiring substrate of the light-emitting device according to the third embodiment. FIG. 6F is a schematic plan view illustrating an example of the wiring substrate of the light-emitting device according to the third embodiment.

A light-emitting device 100B differs from the light-emitting device 100 according to the first embodiment in that a first light-emitting portion 11A and a second light-emitting portion 12A of a light-emitting element 10A have different areas in plan view. Specifically, a light-emitting surface of the first light-emitting portion 11A is larger than a light-emitting surface of the second light-emitting portion 12A in plan view. With this structure, even when a wiring substrate 50A includes a wiring 52A serially connecting the first light-emitting portion 11A and the second light-emitting portion 12A, the first light-emitting portion 11A and the second light-emitting portion 12A can have different current densities during light emission.

A semiconductor layered body of the first light-emitting portion 11A includes a first semiconductor layer 111A, a light-emitting layer 112A, and a second semiconductor layer 113A from the support substrate 15 side. A semiconductor layered body of the second light-emitting portion 12A includes a first semiconductor layer 121A, a light-emitting layer 122A, and a second semiconductor layer 123A from the support substrate 15 side. The first light-emitting portion 11A and the second light-emitting portion 12A are disposed adjacent to each other with a gap therebetween on the second surface 15*b* of the support substrate 15. The first light-emitting portion 11A is provided with three electrodes of an N-side electrode 161A, a P-side electrode 162A, and an N-side electrode 163A, as a first element electrode 16A. Similarly, the second light-emitting portion 12A is provided with three electrodes of an N-side electrode 171A, a P-side electrode 172A, and an N-side electrode 173A, as a second element electrode 17A. The first element electrode 16A and the second element electrode 17A are sized according to the difference in area between the first light-emitting portion 11A and the second light-emitting portion 12A.

The wiring substrate 50A includes the wiring 52A serially connecting the first light-emitting portion 11A and the second light-emitting portion 12A.

The wiring 52A includes, for example, a first wiring 521A, a second wiring 522A, and a third wiring 523A. The first wiring 521A is provided with the P-side electrode 172A, the second wiring 522A is provided with the N-side electrodes 161A and 163A, and the third wiring 523A is provided with the P-side electrode 162A, the N-side electrode 171A, and the N-side electrode 173A. In addition, the first wiring 521A and the second wiring 522A are provided with an electronic component 543. With the wiring 52A, the wiring substrate 50A allows the first light-emitting portion 11A and the second light-emitting portion 12A to have different current densities during light emission.

Fourth Embodiment

Figure 7A:
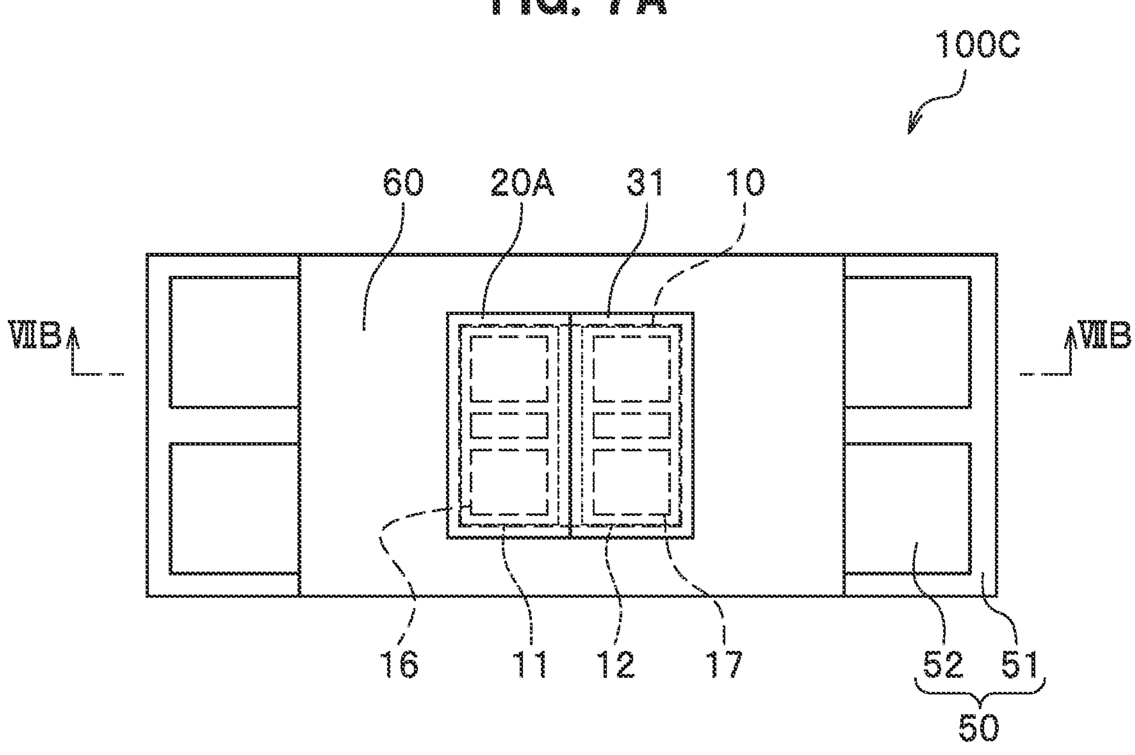
FIG. 7A is a schematic plan view illustrating an example of a light-emitting device according to a fourth embodiment.
Figure 7B:
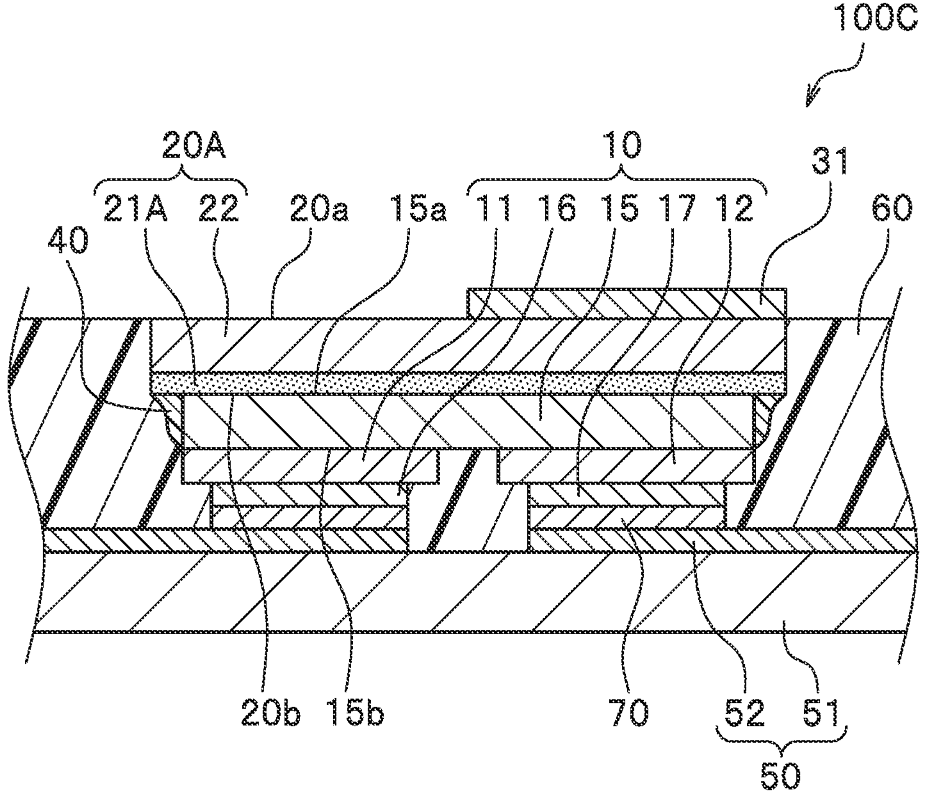
FIG. 7B is a schematic cross-sectional view taken along line VIIB-VIIB of FIG. 7A.
Figure 8A:
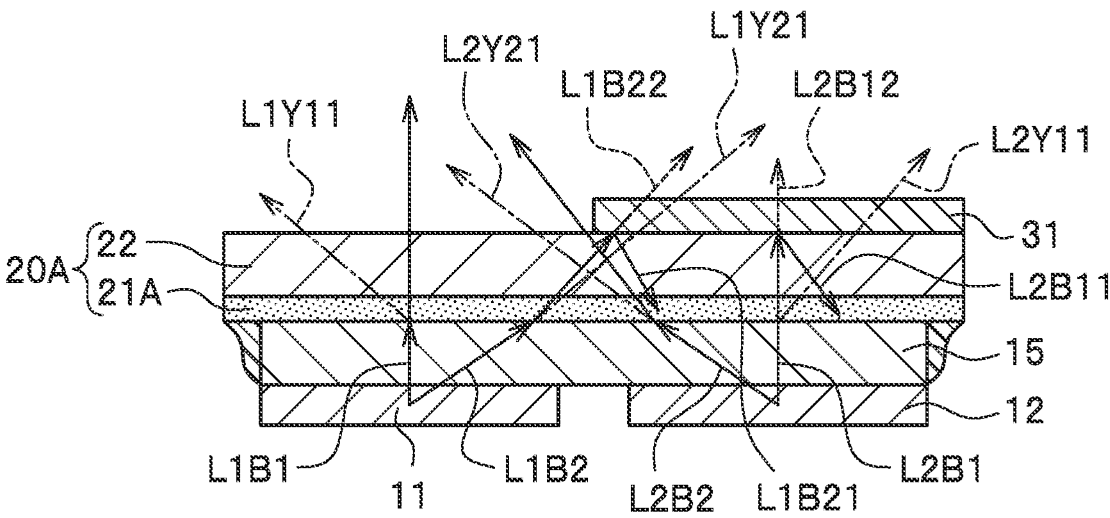
FIG. 8A is a schematic cross-sectional view for explaining an optical path of light from a light-emitting portion of the light-emitting device according to the fourth embodiment.
Figure 8B:
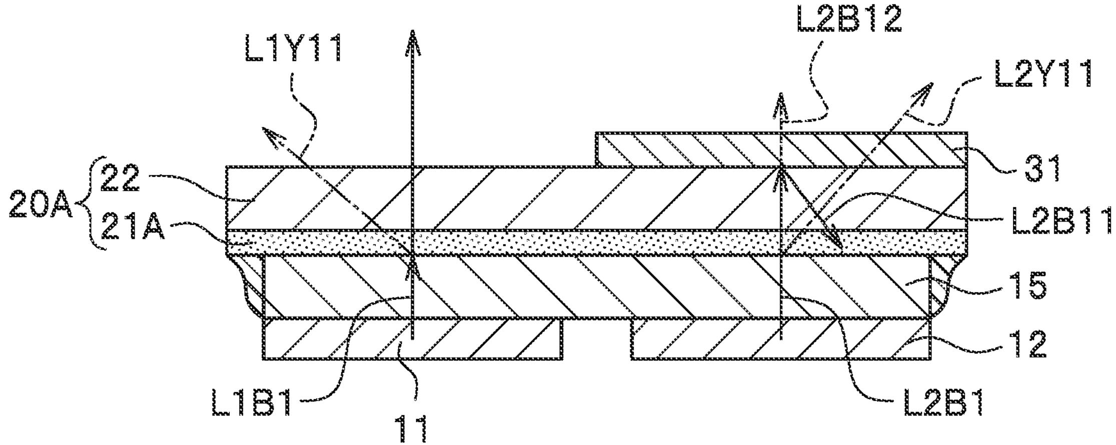
FIG. 8B is a schematic cross-sectional view simplifying FIG. 8A.

FIG. 7A is a schematic plan view illustrating an example of a light-emitting device according to a fourth embodiment. FIG. 7B is a schematic cross-sectional view taken along line VIM-VIM of FIG. 7A. FIG. 8A is a schematic cross-sectional view for explaining an optical path of light from the light-emitting portions of the light-emitting device according to the fourth embodiment. FIG. 8B is a schematic cross-sectional view simplifying FIG. 8A.

A light-emitting device 100C differs from the light-emitting device 100 according to the first embodiment in that the phosphor concentration of a wavelength conversion layer 21A in a wavelength conversion member 20A is low. In addition, a light adjustment member 31 is a member that reflects the second light and transmits the third light, and is disposed overlapping the second light-emitting portion 12 in plan view. For this arrangement, the wavelength conversion member 20A is disposed such that the light adjustment member 31 is disposed overlapping the second light-emitting portion 12 in plan view in the step S13 of disposing the wavelength conversion member.

The phosphor concentration of the wavelength conversion layer 21A is preferably set in accordance with the first light having a low emission intensity that is emitted from the first light-emitting portion 11. Specifically, it is preferably set in accordance with the peak wavelength during light emission of the first light-emitting portion 11. Preferably, the phosphor concentration of the wavelength conversion layer 21A is, for example, in a range from 50 mass % to 60 mass %.

In the present embodiment, the refractive index of the low refractive index layer is preferably in a range from 1.2 to 1.6, and the refractive index of the high refractive index layer is preferably in a range from 2.0 to 2.6. When these two layers are layered as a set, ten or more sets are preferably used to form the light adjustment member 31. When the refractive index of silicon oxide is 1.46, the refractive index of niobium oxide is 2.25, and the wavelength desired to be cut is 400 nm (±100 nm), the thickness of a single silicon oxide film is, for example, 68 nm, and the thickness of a single niobium oxide film is, for example, 44 nm.

The ratio of the phosphor concentration (low concentration) of the wavelength conversion layer 21A of the light-emitting device 100C to the phosphor concentration (high concentration) of the wavelength conversion layer 21 of the light-emitting device 100C is preferably about 100 (low concentration): 101 to 120 (high concentration), for example, when the emission intensity ratio between weak emission and strong emission of the light-emitting portion is 1 to 20:100.

Specifically, when a current value difference between the light-emitting portions is 0.1 A (weak emission): 1 A (strong emission), a difference between the peak wavelengths is +2.1 nm (weak emission): 0 nm (strong emission), and a difference in chromaticity y is about +0.015:0. When the phosphor concentration is increased by 8 mass %, the chromaticity y changes by about +0.018. Therefore, the phosphor concentration ratio is preferably set to about 100 (low concentration):108 (high concentration).

In the light-emitting device 100C, the second light having a high emission intensity that is emitted from the second light-emitting portion 12 is less likely to be converted into the third light in the wavelength conversion layer 21A than desired, compared to the first light having a low emission intensity that is emitted from the first light-emitting portion 11. For the light emission peak wavelengths of light obtained by wavelength conversion, the light emission peak wavelength of the third light obtained by wavelength conversion of the first light is longer than that of the third light obtained by wavelength conversion of the second light. Therefore, by disposing the light adjustment member 31 such that it overlaps the second light-emitting portion 12 that emits the second light, in plan view, the emission, from the light-emitting device 100C, of the second light that is not subjected to wavelength conversion and the first light that is not subjected to wavelength conversion and emitted from the second light-emitting portion 12 side can be suppressed, thus improving uneven chromaticity.

By referring to FIGS. 8A and 8B, improvement of uneven chromaticity of the emission color by the light adjustment member 31 will be specifically described below. FIGS. 8A and 8B schematically illustrate only some optical paths to simplify the description. Although the traveling direction of the actual light appropriately changes due to refraction, scattering, or the like between and inside the members, illustration thereof may be omitted for simplicity. For the light emission peak wavelengths of the first light and the second light (for example, blue light) emitted from the first light-emitting portion 11 and the second light-emitting portion 12, respectively, the light emission peak wavelength of the first light L1B1 having a low emission intensity is longer than that of the second light L2B1 having a high emission intensity, for example. In this case, for the light emission peak wavelength of light (for example, yellow light) obtained by wavelength conversion, the light emission peak wavelength of the third light L2Y11 obtained by wavelength conversion of the second light L2B1 is shorter than that of the third light L1Y11 obtained by wavelength conversion of the first light L1B1. The phosphor concentration of the wavelength conversion layer 21 is set in accordance with, for example, the first light L1B1 having a low emission intensity that is emitted from the first light-emitting portion 11. Therefore, the phosphor concentration is low for the second light L2B1, causing a large part of the second light L2B1 to be transmitted through the wavelength conversion layer 21A without wavelength conversion.

Since the light adjustment member 31 is disposed overlapping the second light-emitting portion 12 in plan view, a part of the second light L2B1 traveling upward is reflected by the light adjustment member 31 to become second light L2B11 on the second light-emitting portion 12 side. Another part of the second light L2B1 is transmitted through the light adjustment member 31 to become second light L2B12 and the second light L2B12 is emitted from the upper surface of the light adjustment member 31. The third light L2Y11 obtained by wavelength conversion of the second light L2B1 is emitted from the upper surface of the light adjustment member 31, as it is. A large part of the first light L1B2 traveling obliquely upward from the first light-emitting portion 11 to the second light-emitting portion 12 side is reflected by the light adjustment member 31 to become first light L1B21, and the remaining part of the first light L1B2 is transmitted through the light adjustment member 31 to become first light L1B22 and the first light L1B22 is emitted from the upper surface of the light adjustment member 31. The third light L1Y21 obtained by wavelength conversion of the first light L1B2 is emitted from the upper surface of the light adjustment member 31, as it is.

On the other hand, on the first light-emitting portion 11 side, the first light L1B1 and the third light L1Y11 obtained by wavelength conversion of the first light L1B1 are emitted from the upper surface of the wavelength conversion member 20, as it is. The second light L2B2 emitted from the second light-emitting portion 12 and traveling obliquely upward to the first light-emitting portion 11 side and the third light L2Y21 obtained by wavelength conversion of the second light L2B2 are emitted from the upper surface of the wavelength conversion member 20, as it is.

At this time, since the third light L2Y11 has a shorter wavelength (that is, closer to blue) than the third light L1Y11, a part of the second light L2B1 (blue light) is reflected by the light adjustment member 31 to adjust the chromaticity of light emitted from the second light-emitting portion 12 side. This can reduce a difference in chromaticity between light emitted from the first light-emitting portion 11 side and light emitted from the second light-emitting portion 12 side, improving the uneven chromaticity of white light having a luminance difference that is emitted from the light-emitting device 100C.

Fifth Embodiment

Figure 9A:
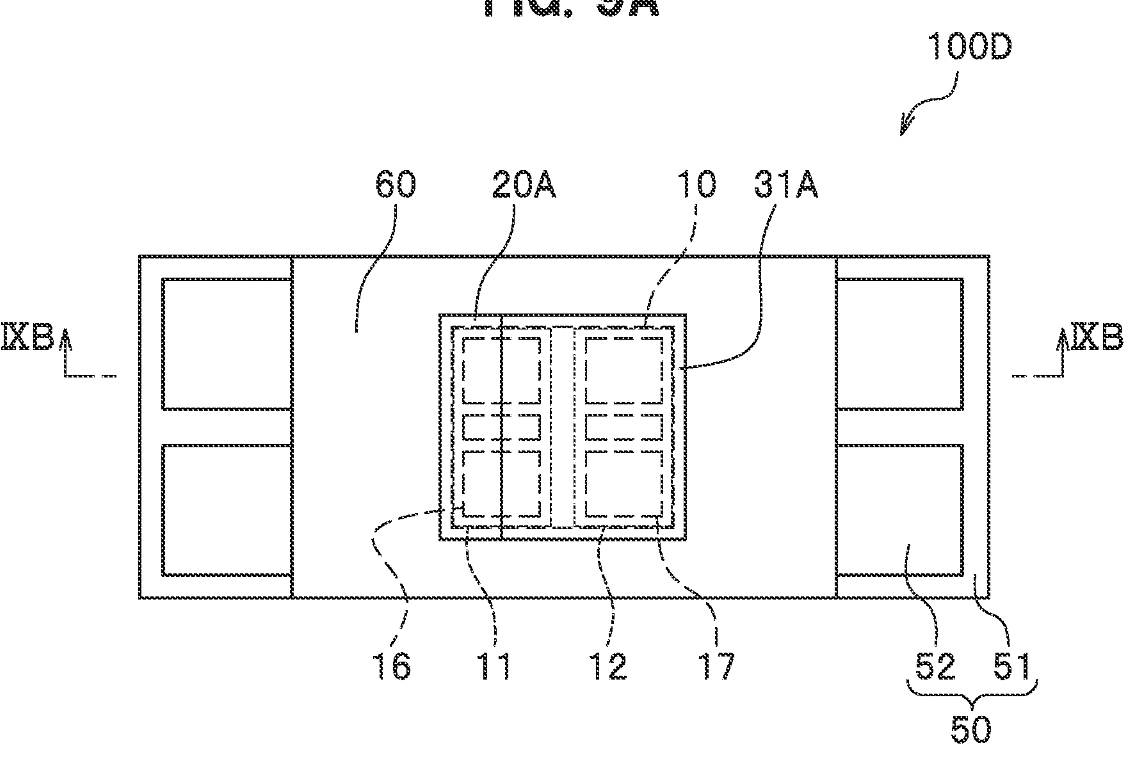
FIG. 9A is a schematic plan view illustrating an example of a light-emitting device according to a fifth embodiment.
Figure 9B:
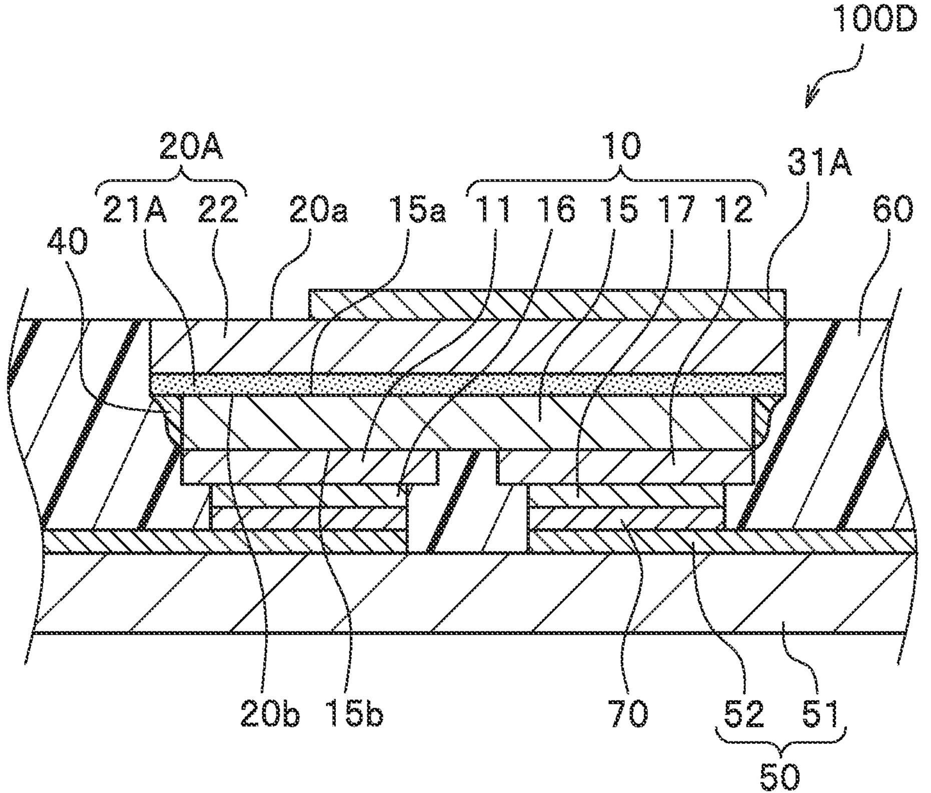
FIG. 9B is a schematic cross-sectional view taken along line IXB-IXB of FIG. 9A.

FIG. 9A is a schematic plan view illustrating an example of a light-emitting device according to a fifth embodiment. FIG. 9B is a schematic cross-sectional view taken along line IXB-IXB of FIG. 9A.

A light-emitting device 100D differs from the light-emitting device 100C according to the fourth embodiment in that a light adjustment member 31A extends up to a position overlapping a part of the first light-emitting portion 11 in plan view.

The light adjustment member 31A overlaps the second light-emitting portion 12 and extends up to a position overlapping about half the first light-emitting portion 11, in plan view. With this structure, it is possible to further suppress the emission, from the light-emitting device 100D, of the first light and the second light that are not subjected to wavelength conversion by the wavelength conversion layer 21A.

Sixth Embodiment

Figure 10A:
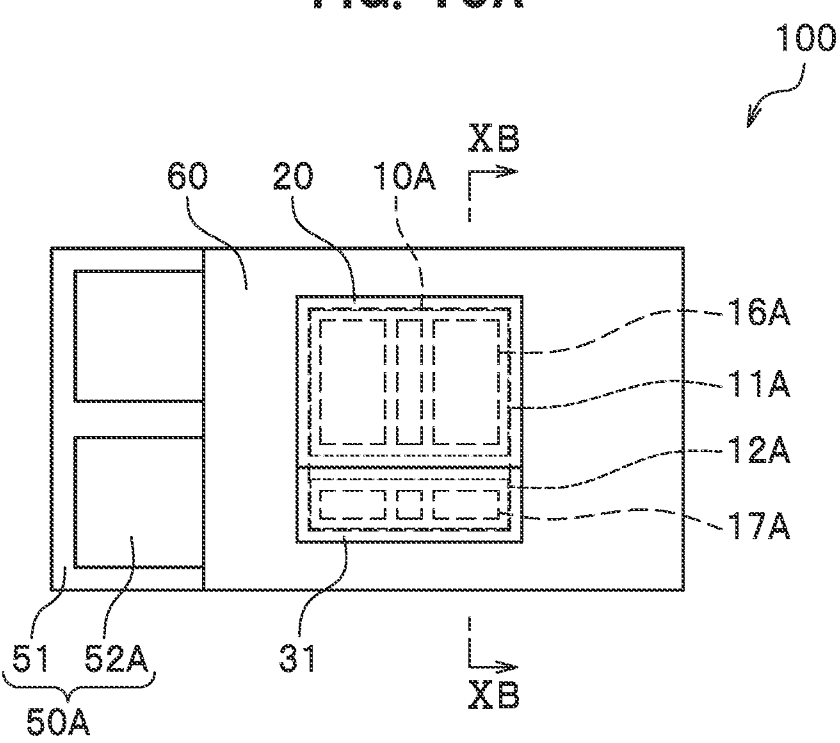
FIG. 10A is a schematic plan view illustrating an example of a light-emitting device according to a sixth embodiment.
Figure 10B:
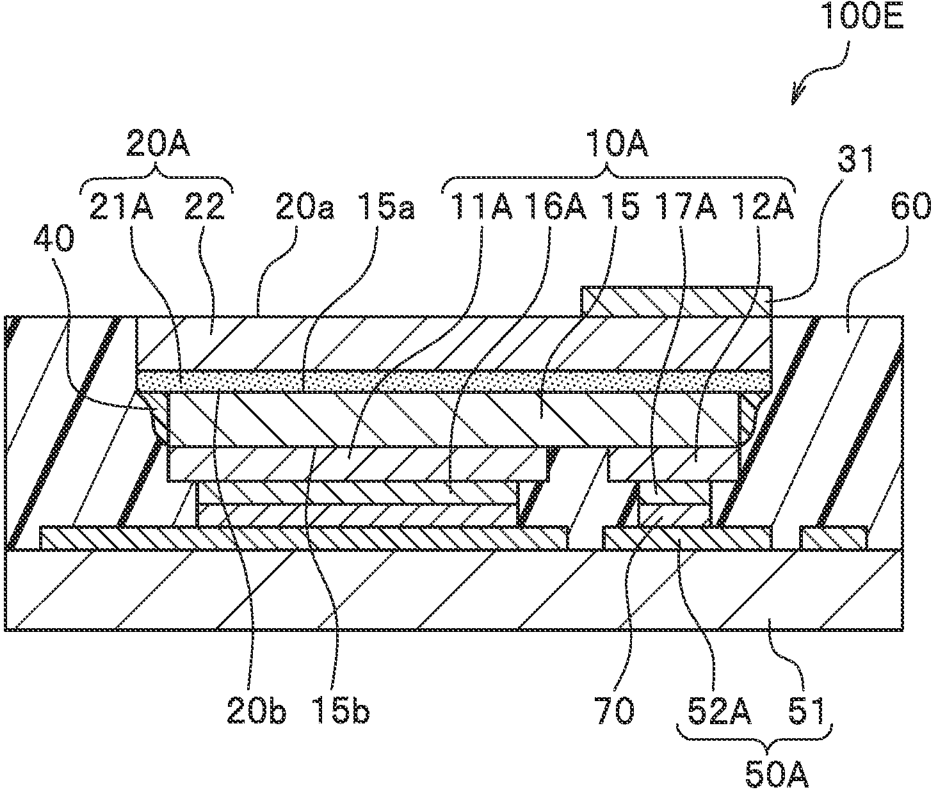
FIG. 10B is a schematic cross-sectional view taken along line XB-XB of FIG. 10A.

FIG. 10A is a schematic plan view illustrating an example of a light-emitting device according to a sixth embodiment. FIG. 10B is a schematic cross-sectional view taken along line XB-XB in FIG. 10A.

A light-emitting device 100E differs from the light-emitting device 100C according to the fourth embodiment in that a light-emitting surface of the first light-emitting portion 11A is larger than a light-emitting surface of the second light-emitting portion 12A in plan view. In addition, the wiring substrate 50A includes the wiring 52A serially connecting the first light-emitting portion 11A and the second light-emitting portion 12A. The wiring 52A can be sized according to a difference in area between the first light-emitting portion 11A and the second light-emitting portion 12A. With this structure, even when the wiring substrate 50A includes the wiring 52A serially connecting the first light-emitting portion 11A and the second light-emitting portion 12A, the first light-emitting portion 11A and the second light-emitting portion 12A can have different current densities during light emission.

Seventh Embodiment

Figure 11A:
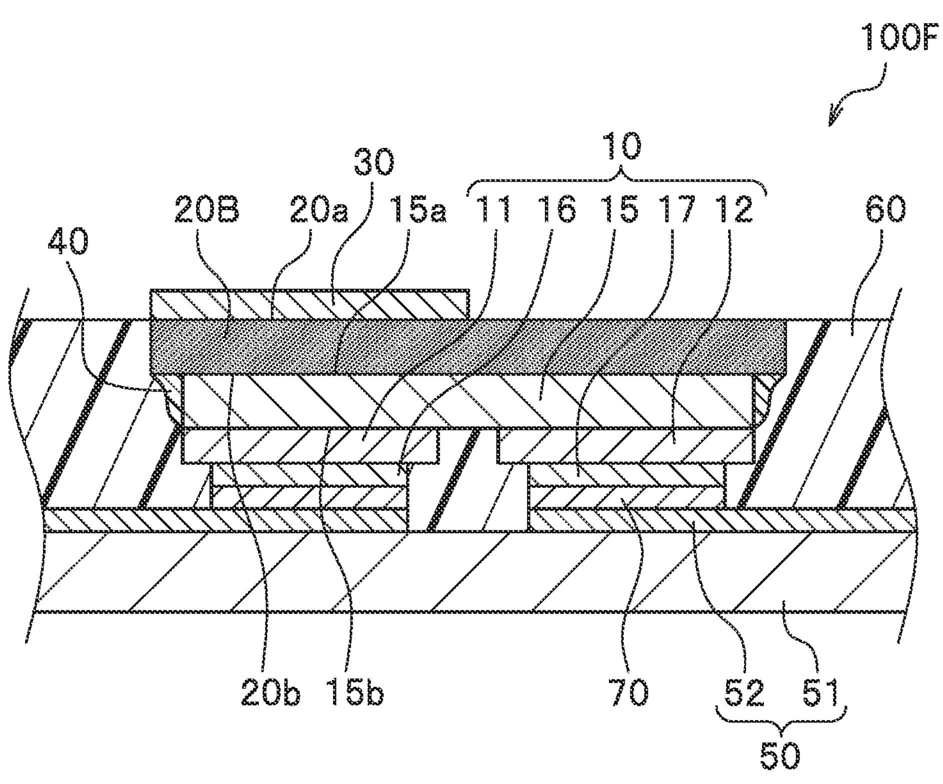
FIG. 11A is a schematic cross-sectional view illustrating an example of a light-emitting device according to a seventh embodiment.

FIG. 11A is a schematic cross-sectional view illustrating an example of a light-emitting device according to a seventh embodiment.

A light-emitting device 100F differs from the light-emitting device 100 according to the first embodiment in that a wavelength conversion member 20B is composed of a single wavelength conversion layer. The wavelength conversion member 20B may be composed of, for example, only a single layer of the wavelength conversion layer 21 described for the light-emitting device 100. Furthermore, the wavelength conversion member 20B may be made of a sintered body of a phosphor. The phosphor concentration of the wavelength conversion member 20B is, for example, preferably in a range from about 90 mass % to 100 mass %. The phosphor concentration refers to the proportion of the phosphor in the total amount of the wavelength conversion member 20B containing the phosphor. In addition, the wavelength conversion member 20B may include a light diffusion member, as necessary.

Eighth Embodiment

Figure 11B:
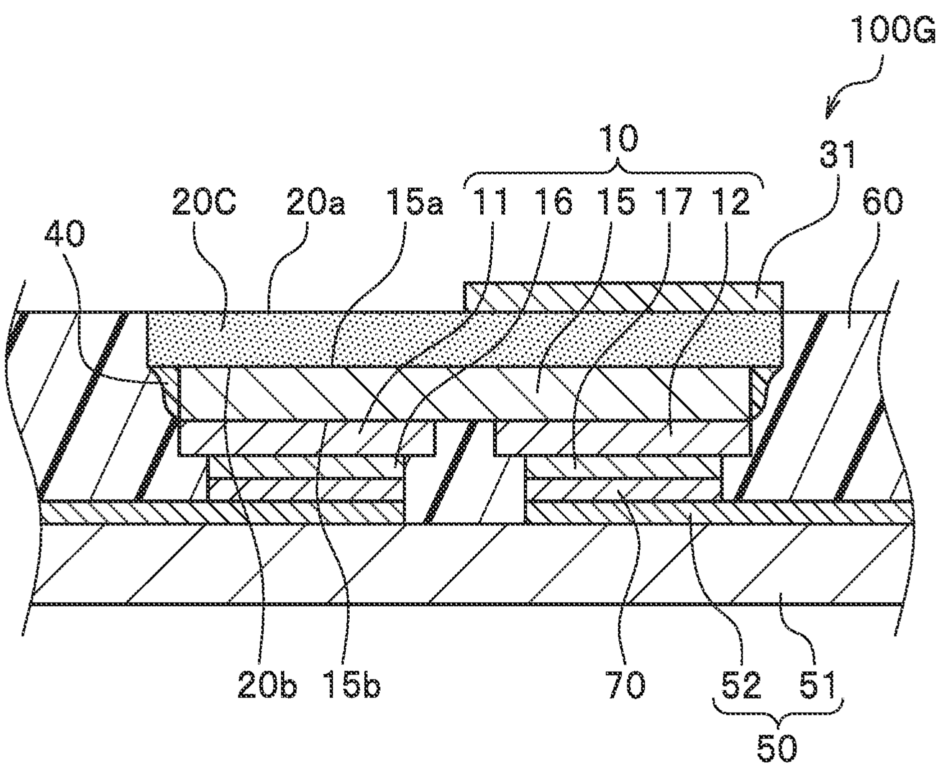
FIG. 11B is a schematic cross-sectional view illustrating an example of a light-emitting device according to an eighth embodiment.

FIG. 11B is a schematic cross-sectional view illustrating an example of a light-emitting device according to an eighth embodiment.

A light-emitting device 100G differs from the light-emitting device 100C according to the fourth embodiment in that a wavelength conversion member 20C is made of a single wavelength conversion layer. The wavelength conversion member 20C may be, for example, only a single layer of the wavelength conversion layer 21A described for the light-emitting device 100C. The wavelength conversion member 20C may be made of a sintered body of the phosphor. The phosphor concentration of the wavelength conversion member 20C is, for example, in a range from 80 mass % to 90 mass %. The phosphor concentration refers to the proportion of the phosphor in the total amount of the wavelength conversion member 20C containing the phosphor. In addition, a light diffusion member may be added to the wavelength conversion member 20C, as needed.

The light-emitting device according to the present embodiment and the method for manufacturing the light-emitting device have been specifically described above by means of the embodiments for carrying out the invention, but the spirit of the present invention is not limited to these descriptions and should be interpreted broadly based on the appended claims. Various modifications, variations, and the like based on these descriptions are also included within the spirit of the present invention. Further, the aforementioned embodiments may be implemented in combination with each other.

For example, the light-emitting device may include three or more light-emitting portions. In addition, the number of element electrodes disposed on one light-emitting portion may be two, or four or more. The light guide member and the covering member need not be provided. The wavelength conversion member includes three or more layers. In that case, the phosphor concentration is the ratio of the phosphor to the total amount of the phosphor-containing layer in the wavelength conversion member. When the first light-emitting portion and the second light-emitting portion have the same area in plan view, a wiring substrate provided with a wiring that serially connects the first light-emitting portion and the second light-emitting portion may be provided with a constant-current diode to make the first light-emitting portion and the second light-emitting portion have different current densities during light emission. Even when the first light-emitting portion and the second light-emitting portion have different areas in plan view, the first light-emitting portion and the second light-emitting portion may be individually driven to have different current densities during light emission.

Furthermore, in the method for manufacturing the light-emitting device, the order of some steps is not limited, and the order can be reversed. For example, the light adjustment member may be disposed on the wavelength conversion member after the wavelength conversion member is disposed on the light-emitting element. The light adjustment member may be disposed on the wavelength conversion member after the covering member is disposed on the wiring substrate. The wavelength conversion member may be disposed on the light-emitting element after the light-emitting element is disposed on the wiring substrate.

Some aspects of light-emitting devices and methods for manufacturing the light-emitting devices according to the embodiments of the present disclosure are as follows.

Aspect 1

A light-emitting device including a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; a wavelength conversion member disposed on the first surface of the support substrate and containing a phosphor that performs wavelength conversion of first light emitted from the first light-emitting portion and second light emitted from the second light-emitting portion into third light; and a light adjustment member disposed on a surface of the wavelength conversion member opposite to a surface on the support substrate side and overlapping one of the first light-emitting portion and the second light-emitting portion in plan view, in which in the light-emitting element, an emission intensity of the first light at a light emission peak wavelength of the second light is lower than an emission intensity of the second light at the light emission peak wavelength of the second light, during light emission of the light-emitting device.

Aspect 2

The light-emitting device according to the aspect 1, in which the wavelength conversion member includes a wavelength conversion layer containing the phosphor, and a light-transmissive member supporting the wavelength conversion layer.

Aspect 3

The light-emitting device according to the aspect 1 or 2, in which a light emission peak wavelength of the first light is longer than the light emission peak wavelength of the second light, the light adjustment member reflects the third light and transmits the first light, and the light adjustment member is disposed overlapping the first light-emitting portion in plan view.

Aspect 4

The light-emitting device according to the aspect 1 or 2, in which a light emission peak wavelength of the first light is longer than the light emission peak wavelength of the second light, the light adjustment member reflects the second light and transmits the third light, and the light adjustment member is disposed overlapping the second light-emitting portion in plan view.

Aspect 5

The light-emitting device according to any one of the aspects 1 to 4, in which the first light-emitting portion and the second light-emitting portion have different current densities during light emission.

Aspect 6

The light-emitting device according to the aspect 5, in which the first light-emitting portion and the second light-emitting portion have the same area in plan view.

Aspect 7

The light-emitting device according to the aspect 5, in which the first light-emitting portion and the second light-emitting portion have different areas in plan view.

Aspect 8

The light-emitting device according to the aspect 6 or 7, further including a wiring substrate provided with the light-emitting element, in which the wiring substrate includes a wiring that can drive the first light-emitting portion and the second light-emitting portion individually.

Aspect 9

The light-emitting device according to the aspect 7, further including a wiring substrate provided with the light-emitting element, in which the wiring substrate includes a wiring serially connecting the first light-emitting portion and the second light-emitting portion.

Aspect 10

The light-emitting device according to any one of the aspects 1 to 9, in which the light adjustment member is disposed overlapping one of the first light-emitting portion and the second light-emitting portion in plan view and extends to a position overlapping a part of the other of the first light-emitting portion and the second light-emitting portion.

Aspect 11

The light-emitting device according to any one of the aspects 1 to 10, in which the light adjustment member is a dielectric multilayer film.

Aspect 12

The light-emitting device according to any one of the aspects 1 to 11, in which the emission intensity of the first light is in a range from 10 to 70 when the emission intensity of the second light is 100 during light emission.

Aspect 13

The light-emitting device according to any one of the aspects 1 to 12, in which the light emission peak wavelengths of the first light and the second light during light emission are in a range from 420 nm to 460 nm, and a light emission peak wavelength of the third light is in a range from 500 nm to 600 nm.

Aspect 14

The light-emitting device according to any one of the aspects 1 to 13, in which a difference between the light emission peak wavelengths of the first light and the second light during light emission is in a range from 0.1 nm to 15 nm.

Aspect 15

A method for manufacturing a light-emitting device, including preparing a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order; preparing a wavelength conversion member having a first surface and a second surface opposite to the first surface and containing a phosphor that performs wavelength conversion of first light emitted from the first light-emitting portion and second light emitted from the second light-emitting portion into third light, the first surface of the wavelength conversion member being provided with a light adjustment member; and disposing the wavelength conversion member provided with the light adjustment member such that the second surface of the wavelength conversion member faces the first surface of the support substrate, in which in the disposing the wavelength conversion member, the light adjustment member is disposed overlapping one of the first light-emitting portion and the second light-emitting portion in plan view.

Aspect 16

The method for manufacturing a light-emitting device, according to the aspect 15, in which the wavelength conversion member includes a wavelength conversion layer containing the phosphor and a light-transmissive member supporting the wavelength conversion layer, and in the disposing the wavelength conversion member, the wavelength conversion member is disposed such that a surface on the wavelength conversion layer side is located on the first surface side of the support substrate.

Aspect 17

The method for manufacturing a light-emitting device, according to the aspect 15 or 16, in which the light adjustment member reflects the third light and transmits the first light, and in the disposing the wavelength conversion member, the light adjustment member is disposed overlapping the first light-emitting portion in plan view.

Aspect 18

The method for manufacturing a light-emitting device, according to the aspect 15 or 16, in which the light adjustment member reflects the second light and transmits the third light, and in the disposing the wavelength conversion member, the light adjustment member is disposed overlapping the second light-emitting portion in plan view.

The light-emitting devices according to the embodiments of the present disclosure can be preferably utilized for vehicle lighting such as headlights. In addition, the light-emitting devices according to the embodiments of the present disclosure can be utilized for the light source for a backlight of a liquid crystal display, various types of lighting fixtures, a large display, various types of display devices for advertisements, destination information, and the like, and further, a digital video camera, image reading devices in a facsimile, a copy machine, a scanner, and the like, and a projector device, for example.

What is claimed is:

1. A light-emitting device comprising:

a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order;

a wavelength conversion member disposed on the first surface of the support substrate and containing a phosphor configured to perform wavelength conversion of first light emitted from the first light-emitting portion and second light emitted from the second light-emitting portion into third light; and a light adjustment member disposed on a surface of the wavelength conversion member opposite to a surface on a support substrate side, the light adjustment member overlapping one of the first light-emitting portion and the second light-emitting portion in a plan view, wherein in the light-emitting element, an emission intensity of the first light at a light emission peak wavelength of the second light is lower than an emission intensity of the second light at the light emission peak wavelength of the second light, during light emission of the light-emitting device, a light emission peak wavelength of the first light is longer than the light emission peak wavelength of the second light, the light adjustment member is configured to reflect the third light and transmit the first light, and the light adjustment member overlaps the first light-emitting portion in the plan view.

2. The light-emitting device according to claim 1, wherein the wavelength conversion member includes a wavelength conversion layer containing the phosphor, and a light-transmissive member supporting the wavelength conversion layer.

3. The light-emitting device according to claim 1, wherein the first light-emitting portion and the second light-emitting portion have different current densities during light emission.

4. The light-emitting device according to claim 3, wherein an area of the first light-emitting portion is equal to an area of the second light-emitting portion in the plan view.

5. The light-emitting device according to claim 3, wherein an area of the first light-emitting portion is different from an area of the second light-emitting portion in the plan view.

6. The light-emitting device according to claim 1, wherein the light adjustment member overlaps one of the first light-emitting portion and the second light-emitting portion and extends to a position overlapping a part of the other of the first light-emitting portion and the second light-emitting portion in the plan view.

7. The light-emitting device according to claim 1, wherein the light adjustment member is a dielectric multilayer film.

8. The light-emitting device according to claim 1, wherein when the emission intensity of the second light at the light emission peak wavelength of the second light is 100 during light emission, the emission intensity of the first light at the light emission peak wavelength of the second light is in a range from 10 to 70.

9. The light-emitting device according to claim 1, wherein the light emission peak wavelengths of the first light and the second light during light emission are in a range from 420 nm to 460 nm, and a light emission peak wavelength of the third light is in a range from 500 nm to 600 nm.

10. The light-emitting device according to claim 1, wherein a difference between the light emission peak wavelength of the first light and the light emission peak wavelength of the second light during light emission is in a range from 0.1 nm to 15 nm.

11. The light-emitting device according to claim 4, further comprising a wiring substrate on which the light-emitting element is disposed, wherein the wiring substrate includes a wiring configured to individually drive the first light-emitting portion and the second light-emitting portion.

12. The light-emitting device according to claim 5, further comprising a wiring substrate on which the light-emitting element is disposed, wherein the wiring substrate includes a wiring serially connecting the first light-emitting portion and the second light-emitting portion.

13. A method for manufacturing a light-emitting device, comprising:

preparing a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order;

preparing a wavelength conversion member having a first surface and a second surface opposite to the first surface and containing a phosphor that performs wavelength conversion of first light emitted from the first light-emitting portion and second light emitted from the second light-emitting portion into third light, the first surface of the wavelength conversion member being provided with a light adjustment member; and disposing the wavelength conversion member provided with the light adjustment member such that the second surface of the wavelength conversion member faces the first surface of the support substrate and the light adjustment member overlaps one of the first light-emitting portion and the second light-emitting portion in a plan view, wherein the light adjustment member is configured to reflect the third light and transmit the first light, and the disposing of the wavelength conversion member includes disposing the wavelength conversion member such that the light adjustment member overlaps the first light-emitting portion in the plan view.

14. The method for manufacturing a light-emitting device according to claim 13, wherein the preparing of the wavelength conversion member includes preparing the wavelength conversion member including a wavelength conversion layer containing the phosphor and a light-transmissive member supporting the wavelength conversion layer, and the disposing of the wavelength conversion member includes disposing the wavelength conversion member such that a surface on a wavelength conversion layer side is located on the first surface side of the support substrate.

15. A light-emitting device comprising:

a light-emitting element including a support substrate having a first surface and a second surface opposite to the first surface, and a first light-emitting portion and a second light-emitting portion disposed adjacent to each other on the second surface of the support substrate, the first light-emitting portion and the second light-emitting portion each including a semiconductor layered body including a first semiconductor layer, a light-emitting layer, and a second semiconductor layer in this order;

a wavelength conversion member disposed on the first surface of the support substrate and containing a phosphor configured to perform wavelength conversion of first light emitted from the first light-emitting portion and second light emitted from the second light-emitting portion into third light; and a light adjustment member disposed on a surface of the wavelength conversion member opposite to a surface on a support substrate side, the light adjustment member overlapping one of the first light-emitting portion and the second light-emitting portion in a plan view, wherein in the light-emitting element, an emission intensity of the first light at a light emission peak wavelength of the second light is lower than an emission intensity of the second light at the light emission peak wavelength of the second light, during light emission of the light-emitting device, and a difference between the light emission peak wavelength of the first light and the light emission peak wavelength of the second light during light emission is in a range from 0.1 nm to 15 nm.

16. The light-emitting device according to claim 15, wherein a light emission peak wavelength of the first light is longer than the light emission peak wavelength of the second light, the light adjustment member is configured to reflect the second light and transmit the third light, and the light adjustment member overlaps the second light-emitting portion in the plan view.

* * * * *